US007597459B2

United States Patent
Maeda et al.

(10) Patent No.: US 7,597,459 B2
(45) Date of Patent: Oct. 6, 2009

(54) CONVERGING ELEMENT AND ILLUMINATING DEVICE

(75) Inventors: Makoto Maeda, Osaka (JP); Takashi Ikeda, Osaka (JP); Yoshitaka Kurosaka, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 259 days.

(21) Appl. No.: 11/368,483

(22) Filed: Mar. 7, 2006

(65) Prior Publication Data

US 2006/0196944 A1    Sep. 7, 2006

(30) Foreign Application Priority Data

Mar. 7, 2005  (JP) .............................. 2005-062138
Mar. 15, 2005 (JP) .............................. 2005-072908
Aug. 31, 2005 (JP) .............................. 2005-252818

(51) Int. Cl.
 *F21V 3/02* (2006.01)
(52) U.S. Cl. .................... 362/268; 362/84; 362/298; 362/299; 362/300
(58) Field of Classification Search .............. 362/84, 362/268, 298–300
See application file for complete search history.

(56) References Cited

U.S. PATENT DOCUMENTS 6,499,863 B2 * 12/2002 Dewald ...................... 362/268

2004/0207999 A1 * 10/2004 Suehiro et al. ................ 362/84
2006/0279710 A1 * 12/2006 Tani ............................ 353/85

FOREIGN PATENT DOCUMENTS

| JP | 61-147585 | 7/1986 |
|---|---|---|
| JP | 2002-189263 | 7/2002 |

* cited by examiner

*Primary Examiner*—Sandra L O'Shea
*Assistant Examiner*—Meghan K Dunwiddie
(74) *Attorney, Agent, or Firm*—NDQ&M Watchstone LLP

(57) ABSTRACT

An LED light source is formed of an LED and an angle control lens. The angle control lens includes a transparent member in a shape of a rotational symmetry, and includes a center convex curved surface area (light-emission area) A1, a peripheral curved surface area (light-emission area) B1, a peripheral curved surface reflection area C1, a center concave curved surface area (light-incidence area) D, and a convex curved surface area E formed between the areas A1, B1. The convex curved surface area E is formed in a position for receiving direct incoming light from the LED (direct incoming light deviated from the center portion), and is optically constructed to anteriorly emit this received light (in a direction intended to be emitted as a result of a light-emission angle being controlled).

14 Claims, 17 Drawing Sheets

CONVERGING ELEMENT AND ILLUMINATING DEVICE

BACKGROUND OF THE INVENTION

1. Field of the Invention

The present invention relates to a converging element and an illuminating device.

A generally used illuminating device used for a liquid crystal projector is formed of a lamp such a ultra-high pressure mercury lamp, a metal halide lamp, a xenon lamp, and etc., and a parabolic reflector for collimating irradiating light from these lamps. In addition, to date, it is attempted to use a light-emitting diode (LED) as a light source (see Japanese Patent Laying-open No. 2002-189263).

FIG. 25A, FIG. 25B, and FIG. 25C show configuration examples of the light sources formed of a light-emitting diode. The Light source 400 shown in FIG. 25A has structure in which an LED chip is covered with a hemispheric resin (a hemispheric lens cover). Such the light source 400 needs a lens for controlling a dispersion angle of light due to its face that the emission light from the LED chip is dispersed. If a biconvex lens or a meniscus lens is arranged on a light-emission side of the light source 400, for example, it is possible to obtain approximately collimated light. In addition, a light source 401 shown in FIG. 25B is a light source having an angle control lens 401a of which outer curved surface is a total-reflection surface and of which light-emission surface is plane in shape (Japanese Patent Laying-open No. S61-147585). In addition, a light source 402 shown in FIG. 25C is a light source having an angle control lens 402a of which outer curved surface is a total-reflection surface and which is formed with a plurality of curved surface areas on a light-emission surface (such the light source 402 is offered by Lumileds Lighting, U.S. LLC).

FIG. 26 shows a light source 403 provided with an angle control lens 403a approximately same as the angle control lens 402a shown in above FIG. 25C. The angle control lens 403a is formed of a transparent material in a shape of a rotational symmetry, and includes a convex curved surface area (light-emission area) A formed in a center portion thereof, a peripheral curved surface area (light-emission area) B, a peripheral curved surface reflection area C, and a concave curved surface area (light-incidence area) D formed in the center portion. In the concave curved surface area D, an LED 403b having the hemispheric lens cover is provided.

SUMMARY OF THE INVENTION

Out of lights emitted from the LED 403b, the light reflected by the peripheral curved surface reflection area C is emitted in a direction from the peripheral curved surface area B (in a direction intended to be emitted as a result of an emission angle of light being controlled). However, out of the lights emitted from the LED 403b, the light directly advancing in a direction of the peripheral curved surface area B is totally reflected by the peripheral curved surface area B, and as a result, is emitted to a lateral direction (in a direction not intended to be emitted as a result of the emission angle of light being controlled). Furthermore, the light advancing to the convex curved surface area A close to the peripheral curved surface area B is totally reflected in a repeated manner within the convex curved surface area A, and emitted to a rear direction (in a direction not intended to be emitted as a result of the emission angle of light being controlled).

As FIG. 27A shows, the emission lights from the LED 403b are incident upon a first range (1), a second range (2), and a third range (3). The first range (1) is a range where the emission light is incident upon the convex curved surface area A, the second range (2) is a range where the emission light is directly incident upon the peripheral curved surface area B, and the third range (3) is a range where the emission light is incident upon the peripheral curved surface area B after being reflected by the peripheral curved surface reflection area C. A light amount in the second range (2) is larger than that of any other range as shown in FIG. 27B. In order that a projected image is rendered bright, it needs to efficiently use the light in the second range (2), and it is desired that the light from the light source is used as much as possible. It is noted that the angle range shown in FIG. 27B is an example, and the LED 403b may have an angle range different from the above angle range.

Furthermore, as FIG. 28 shows, if a size of a light entrance surface of an optical member (rod integrator, for example) 404 for receiving the light from the light source 403 is smaller than that of a light-emission range of the light source 403, peripheral light emitted from the light source 403 is not incident upon the optical member 404, and at most 70 percent of the light amount is used, for example. As FIG. 29 shows, if, out of all light amounts to be used, a light amount on a center portion (center-axis area in FIG. 29) is a, and a light amount on a peripheral side (area in a shape of a donut in FIG. 29) is b, b is much larger than a (for example, b is more than twice a), and therefore, it needs to efficiently use peripheral light in order to realize high luminance.

In view of the above circumstances, an object of the present invention is to provide a converging element capable of improving utilization efficiency of light, and an illuminating device using the converging element.

In order to solve the above problem, a converging element of the present invention is a converging element for guiding the light emitted from a light emitting element to a predetermined direction, and comprises a light-incidence area for receiving the light emitted from the light emitting element, a first light-emission area for directly receiving center emission light, out of lights emitted from the light emitting element, incident from the light incidence area, and for emitting the light in the predetermined direction, a reflection area for receiving and reflecting a peripheral emission light, out of the lights emitted from the light emitting element, incident from the light incidence area, a second light-emission area, formed on a peripheral side of the first light-emission area, for receiving light reflected in the reflection area and for emitting the light to the predetermined direction, a third light-emission area, formed between the first light-emission area and the second light-emission area, for directly receiving the peripheral emission light, out of lights emitted from the light emitting element, incident from the light incidence area, and for emitting the light to the predetermined direction, and each of the areas being formed of a respectively different surface (hereinafter, referred to as a first converging element in this section).

With the above configuration, as a result of having the third light emission area, a loss of light caused, if the third light emission area is not provided, by a total reflection of the direct incoming light on the second light-emission area can be reduced, thus possible to improve utilization efficiency of light.

In the first converging element, the first light-emission area and the third light-emission area may be formed of convex curved surfaces. In addition, in the converging elements having these configurations, the light-incidence area may be formed of curved or plane surface.

In addition, in the converging elements having these configurations, a converging element further comprises a light-incidence local area formed on the light-incidence area and in a position for receiving lights advancing in a direction of the second light-emission area and a direction of the third light-emission area, in which the light-incidence local area is optically constructed to guide the incident light to the third light-emission area, and the third light-emission area is optically constructed to emit the light from the light-incidence local area in the predetermined direction.

In such the configuration, it becomes possible to reduce a loss of light by a total reflection of the direct incoming light on the second light-emission area, thus possible to further improve utilization efficiency of light. In the converging element of such the configuration, the light-incidence local area may be formed of a convex curved surface.

In the converging elements of such the configurations, all or one portion of each of the areas may be formed of an aspherical surface.

Furthermore, an illuminating device of the present invention comprises any one of the converging elements, and a light emitting element arranged in the light-incidence area of the converging element (hereinafter, referred to as an illuminating device A1 in this section).

The illuminating device A1 may further comprise an optical integrator for rendering uniform on an object to be illuminated intensity of the light emitted from the converging element (hereinafter, referred to as an illuminating device A2 in this section).

In addition, an illuminating device of the present invention comprises a first-color light source placed such that a main optical axis thereof faces a first direction, a second-color light source placed such that a main optical axis thereof faces a second direction, and a third-color light source placed such that a main optical axis thereof faces a third direction, in which the illuminating device A1 or the illuminating device A2 is provided as the light source of each color (hereinafter, referred to as an illuminating device A3 in this section). In the illuminating device A3, it may be possible that the first-color light source emits red light, the second-color light source emits blue light, and the third-color light source emits green light.

In addition, the illuminating device of the present invention comprises a light source for red light placed such that a main optical axis thereof faces a first direction, a light source for blue light placed such that a main optical axis thereof faces a second direction, a light source for green light placed such that a main optical axis thereof faces a third direction, and an optical member for guiding to the same or approximate the same direction the light of each color emitted from the light source of each color, in which the illuminating device A1 or the illuminating device A2 is provided as the light source of each color (hereinafter, referred to as an illuminating device A4 in this section).

In the illuminating device A4, the red light, the green light, and the blue light may be continuously emitted while the illuminating device is illuminated (hereinafter, referred to as an illuminating device A5). Or, in the illuminating device A4, the red light, the green light, and the blue light may be emitted in a time-sequential manner while the illuminating device is illuminated (hereinafter, referred to as an illuminating device A6 in this section).

Furthermore, a projection type video display apparatus is formed of the illuminating device A5, one full-color light valve, and a projection means for projecting image light obtained as a result of being via the full-color light valve.

In addition, the projection type video display apparatus is formed of the illuminating device A6, one light valve, a means for applying video signal of each color in synchronization with emission timing of light of each color, and a projection means for projecting the image light obtained as a result of being via the light valve.

Furthermore, the projection type video display apparatus is formed of the illuminating device A1 or the illuminating device A2 for emitting white light, one full-color light valve, and a projection means for projecting image light obtained as a result of being via the full-color light valve.

In addition, the projection type video display apparatus is formed of the illuminating device A3, three light valves each receiving light from the light source of each color, a mixing means for mixing image light of each color obtained as a result of being via each light valve, and a projection means for projecting mixed image light (full-color image light).

Furthermore, a converging element comprises a a transparent first optical means, for receiving the light emitted from a light emitting element, and for guiding the light to a predetermined direction, a reflective second optical means, provided in a position for receiving peripheral emission light of the first optical means, for guiding the peripheral emission light in a direction approximately crossing a center axis of the first optical means, and a reflective third optical means, arranged close to the center axis inward of the second optical means, for guiding in a direction approximately the same as the predetermined direction by reflecting the peripheral emission light reflected by the second optical means (hereinafter, referred to as a second converging element in this section).

With the second converging element, even in a case that an object to be illuminated has an area smaller than an area of a light-emission area of the first optical means, a reflection effect of the second optical means and the third optical means allows most of the light emitted by the first optical means to be irradiated onto the object to be illuminated. Particularly, in a case that a ratio of a light amount of the emission light of a peripheral side of the first optical means is higher than that of a central portion, utilization efficiency of light is greatly improved compared to the conventional configuration.

In the second converging element, an area ahead of a center portion of the first optical means may be shielded by the third optical means. In such the configuration, the first optical means may emit the light only from a peripheral side of the first optical means. In such the configuration, the light-incidence area of the first optical means may be in such a shape to guide to the peripheral side most of light from a laterally-emitting light emitting element.

In the second converging element, it may be possible that the third optical means has a light-transmission area, and this light-transmission area is located in an area ahead of the center portion of the first optical means. In such the configuration, the first optical means may emit the light both from the center side and the peripheral side. In such the configuration, the light-incidence area of the first optical means may be in a shape to guide to the peripheral side and the center side light from a Lambertian light-emitting element.

In the second converging element or the converging element according thereto, the second optical means and the third optical means may be formed of a reflective means. In such the configuration, the second optical means and the third optical means may be unified. Or, the third optical means may be formed in the first optical means. In the converging elements of such the configurations, it may be possible that the second optical means is an external total-reflection surface formed on one transparent member of which sectional surface is in a shape of a frame, and the third optical means is an inner total-reflection surface formed on the transparent member. In the converging elements of these configurations, reflection surfaces of the second optical means and the third optical means may be spherical or aspherical in shape.

In addition, an illuminating device of the present invention comprises any one of the above-described converging elements (second converging element or the converging element according thereto), and a light-emitting element for irradiating light onto a light-incidence area of the converging element (hereinafter, referred to as an illuminating device B1 in this section).

The illuminating device may further comprise an optical integrator for rendering uniform on an object to be illuminated intensity of the light emitted from the converging element (hereinafter, referred to as an illuminating device B2 in this section).

In addition, the illuminating device of the present invention comprises a first-color light source placed such that a main optical axis thereof faces a first direction, a second-color light source placed such that a main optical axis thereof faces a second direction, and a third-color light source placed such that a main optical axis thereof faces a third direction, in which the illuminating device is provided with the illuminating device B1 or the illuminating device B2 as the light source of each color. In the illuminating device of such the configuration, it may be possible that the first-color light source emits red light, the second-color light source emits blue light, and the third-color light source emits green light (hereinafter, referred to as an illuminating device B3 in this section).

In addition, the illuminating device of the present invention comprises a light source for red light placed such that a main optical axis thereof faces a first direction, a light source for blue light placed such that a main optical axis thereof faces a second direction, a light source for green light placed such that a main optical axis thereof faces a third direction, and an optical member for guiding in the same or approximate the same direction the light of each color emitted from the light source of each color, in which the illuminating device B1 or the illuminating device B2 is provided as the light source of each color (hereinafter, referred to as an illuminating device B4 in this section).

In the illuminating device B4, the red light, the green light, and the blue light may be continuously emitted while the illuminating device is illuminated (hereinafter, referred to as an illuminating device B5). Or, in the illuminating device B4, the red light, the green light, and the blue light may be emitted in a time-sequential manner while the illuminating device is illuminated (hereinafter, referred to as an illuminating device B6 in this section).

Furthermore, a projection type video display apparatus is formed of the illuminating device B5, one full-color light valve, and a projection means for projecting image light obtained as a result of being via the full-color light valve.

In addition, the projection type video display apparatus is formed of the illuminating device B6, one light valve, a means for applying video signal of each color in synchronization with emission timing of light of each color, and a projection means for projecting the image light obtained as a result of being via the light valve.

In addition, the projection type video display apparatus is formed of the illuminating device B1 or the illuminating device B2, one full-color light valve, and a projection means for projecting the image light obtained as a result of being via the full-color light valve.

Furthermore, the projection type video display apparatus is formed of the illuminating device B3, three light valves each receiving light of each color from the light source of each color, a mixing means for mixing image light of each color obtained as a result of being via each light valve, and a projection means for projecting the mixed image light (full-color image light).

In addition, an illuminating device of the present invention comprises a light source including a light emitting element, a light guide means for receiving center emission light, out of emission lights from the light source, and for guiding the light to an object to be illuminated, a first reflection means, provided on a side peripheral to a light entrance surface of the light guide means, for reflecting peripheral emission light, out of the emission lights from the light source, and a second reflection means, provided near the light emitting element, for reflecting in a direction of the light guide means the light reflected by the first reflection means (hereinafter, referred to as an illuminating device C1 in this section).

With such the configuration, the peripheral emission light not guided to the light guide means, out of the lights emitted from the light source, is reflected in a direction of the light source by a first reflection means provided on a peripheral side of an light entrance surface of the light guide means. The light returned in the direction of the light source by the first reflection means is re-reflected by the second reflection means provided near the light-emitting element, and advances in a direction of the light guide means.

Preferably, in the above illuminating device C1, the light source may comprise between the light emitting element and the light guide means, a converging element for guiding the light in a predetermined direction by controlling an emission angle of the light emitted from the light emitting element (hereinafter, referred to as an illuminating device C2 in this section). As a result of provision of the converging element, it becomes possible to render an angle of the emission light from the light source a low dispersion angle, and to guide this light to the light guide means, thus possible to improve utilization efficiency of light.

In addition, the illuminating device of the present invention comprises a plurality of light sources each of which light-emission direction and light-emitting color of the light-emitting element, too, are different, and a color mixing means for mixing the emission lights from the plurality of light sources and guiding in the same or approximate the same direction, and further comprises a first reflection means provided on a peripheral side of each light entrance surface of the color mixing means, the first reflection means for reflecting peripheral emission light, out of the emission lights from the light source, and a second reflection means provided near the light emitting element of the light source, the second reflection means for reflecting in a direction of the light entrance surface of the color mixing means the light reflected by the first reflection means (hereinafter, referred to as an illuminating device C3 in this section).

Preferably, the illuminating device C3 may comprise a light guide means for receiving light mixed by the color mixing means and guiding to an object to be illuminated. Or preferably, in the illuminating device C3, the light source may comprise between the light-emitting element and the light guide means, a converging element for guiding the light in a predetermined direction by controlling an emission angle of the light emitted from the light emitting element. As a result of provision of the converging element, it becomes possible to render an angle of the emission light from the light source a low dispersion angle, and to guide this light to the light guide means, thus possible to improve utilization efficiency of light.

In addition, the illuminating device of the present invention comprises a plurality of light sources each of which light-emitting direction and light-emitting color of the light-emitting element, too, are different, a color mixing means for mixing the emission lights from the plurality of light sources and guiding in the same or approximate the same direction, and a light guide means for receiving the light mixed by the color mixing means and guiding to the object to be illuminated, and further comprises a first reflection means provided on a peripheral side of a light entrance surface of the light guide means, the first reflection means for reflecting peripheral emission light, out of the emission lights from the light source, and a second reflection means provided near the light emitting element, the second reflection means for reflecting in a direction of the light entrance surface of the color mixing means the reflected light by the first reflection means (hereinafter, referred to as an illuminating device C4 in this section).

Preferably, in the illuminating device C4, the light source may comprise between the light emitting element and the light guide means, a converging element for guiding the light in a predetermined direction by controlling an emission angle of the light emitted from the light emitting element. As a result of provision of the converging element, it becomes possible to render an angle of the emission light from the light source a low dispersion angle, and to guide this light to the light guide means, thus possible to improve utilization efficiency of light.

The converging element may be formed of a light-incidence area having emission light from the light source being incident thereupon and at least one light-emission area having the incident light emitted therefrom. In addition, the converging element may be a converging element for emitting the light at a predetermined emission angle by controlling refraction/reflection of an advancing angle of the emission light from the light source.

The converging element may comprise a light-incidence area for receiving light emitted from the light emitting element, a first light-emission area for directly receiving a center emission light, out of lights emitted from the light emitting element, incident from the light incidence area, and for emitting the light in the predetermined direction, a reflection area for receiving and reflecting a peripheral emission light, out of the lights emitted from the light emitting element, incident from the light incidence area, a second light-emission area, formed on a peripheral side of the first light-emission area, for receiving light reflected in the reflection area and for emitting the light to the predetermined direction, and each of the areas being formed of a respectively different surface.

Preferably, at least one surface of each area of the converging element may be spherical or aspherical.

In addition, the converging element may be a rod tapered in shape for lowering an angle of the emission light from the light source by a lateral-side reflection.

Preferably, the first reflection means may be optimized in shape such that peripheral emission light of the converging element is reflected and made incident upon the converging element once again.

Preferably, the converging element is optimized in shape such that the light reflected by the first reflection means and incident upon the converging element once again is guided from the light-incidence area to the second reflection means.

In these illuminating devices (illuminating devices to which a numeral C is attached), it may be possible that a reflective polarizer transmitting linearly polarized light of a specific direction, and on the other hand, returning by reflecting polarized light of the other direction to an incidence side of the light guide means is provided on an light exit surface side of the light guide means, and a ¼λ plate is provided on a light entrance surface side of the light guide means. With such the configuration, the polarized light of the other direction reflected by the reflective polarizer is reflected by the second reflection means, after passing through the ¼λ plate, and passes through the ¼λ plate once again. As result of the linearly polarized light not capable of passing through the reflective polarizer passing through the ¼λ plate twice as described above, a polarization of the linearly polarized light is converted. This makes it possible to allow this linearly polarized light to become linearly polarized light capable of passing through the reflective polarizer. As a consequence, a polarization direction of the emission light of the illuminating device is directed in the same direction.

Preferably, the second reflection means may guide to the light guide means by reflecting the light reflected by the first reflection means.

Preferably, a rod integrator, or an optical integrator formed of a pair of fly's eye lenses may be used for the light guide means.

Preferably, the light source may be a solid light source.

In addition, the projection type video display apparatus comprises the illuminating device to which the numeral C is attached. The illuminating device continuously emits white light. On a light emission side of this illuminating device, a full-color light valve is provided. Each image light modulated as a result of being via the full-color light valve is projected by the projection means.

Furthermore, the projection type video display apparatus comprises the illuminating device to which the numeral C is attached. For example, this illuminating device emits red light, green light, and blue light in a time-sequential manner while being illuminated. On a light emission side of the illuminating device, one light valve is provided. Furthermore, the projection type video display apparatus comprises means for applying a video signal of each color to the light valve in synchronization with emission timing of light of each color, and a projection means for projecting the image light modulated as a result of being via the light valve.

In addition, the projection type video display apparatus comprises a plurality of illuminating devices to which the numeral C is attached. Light of each color emitted from the plurality of illuminating devices produces white light as a whole. In order to obtain the white light, the light of each color is guided by a color mixing means in the same or approximately the same direction. Each illuminating device is continuously illuminated. In a position for receiving the light emitted from the color mixing means, a full-color light valve is provided. Image light modulated as a result of being via the full-color light valve is projected by the projection means.

Furthermore, the projection type video display apparatus comprises a plurality of illuminating devices to which the numeral C is attached. From the plurality of illuminating devices, a plurality of lights in color are emitted. The plurality of lights in color are guided in the same or approximately same the direction by the color mixing means. Each illuminating device is illuminated in a time-sequential manner. In a position for receiving the light emitted from the color mixing means, a light valve is provided. Furthermore, this projection type video display apparatus comprises a means for applying image light of each color to the light valve in synchronization with emission timing of each color, and a projection means for projecting the image light modulated as a result of being via the light valve.

Furthermore, the projection type video display apparatus comprises a plurality of illuminating devices to which the numeral C is attached. From the plurality of illuminating devices, a plurality of lights in color are emitted. In a position for receiving the light of each color, a light valve for each color is provided. Each modulated light (image light of each color) obtained as a result of being via each light valve is guided by the color mixing means in the same or approximately the same direction, and full-color image light is generated. Each illuminating device is continuously illuminated. The full-color image light is projected by the projection means.

According to the present invention, it is possible to improve utilization efficiency of light emitted from the light source.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Hereinafter, a first embodiment of the present invention will be described based on FIGS. 1 to 6.

Figure 1:
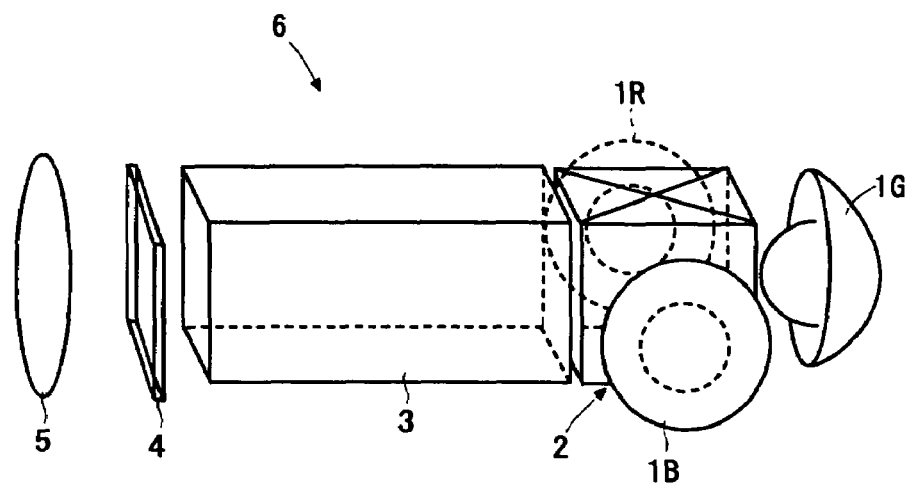
FIG. 1 is a descriptive diagram showing an optical system of a projection type video display apparatus of an embodiment of the present invention.

FIG. 1 is a diagram showing an optical system of a single-panel projection type video display apparatus 6. This projection type video display apparatus 6 is provided with three LED light sources 1R, 1G, and 1B (hereinafter, a numeral "1" will be used for generally referring to each LED light source). The LED light source 1R emits red light, the LED light source 1G emits green light, and the LED light source 1B emits blue light. The LED light source 1G and a rod integrator 3 sandwich a cross dichroic prism 2, and the LED light source 1G faces a light entrance surface of the rod integrator 3. The LED light source 1R and the LED light source 1B sandwich the cross dichroic prism 2, and face each other. That is, the LED light source 1R is arranged on a first light entrance surface of the cross dichroic prism 2, the LED light source 1B is arranged on a second light entrance surface, and the LED light source 1G is arranged on a third light entrance surface.

The light of each color emitted from each LED light source 1 is guided to the light entrance surface of the rod integrator 3 by the cross dichroic prism 2. The rod integrator 3 is formed of transparent glass in a shape of a rectangular prism. An aspect ratio of at least a light exit surface of the rod integrator 3 is approximately equal to that of a liquid crystal display panel 4. The rod integrator 3 reflects the light of each color from each LED light source 1 on a rod inner surface, and guides the light of each color to the liquid crystal display panel 4, so that light intensity distribution of the light of each color is approximately rendered uniform on the liquid crystal display panel 4 (object to be illuminated).

The liquid crystal display panel 4 has structure with an RGB color filter, or structure without the RGB color filter. In a case of using the liquid crystal display panel 4 having the structure with the RGB color filter, all the LED light sources 1R, 1G and 1B are illuminated at the same time, and white light is guided to the liquid crystal display panel 4. On the other hand, in a case of using the liquid crystal display panel 4 having the structure without the RGB color filter, the LED light sources 1R, 1G, and 1B are illuminated in a time-sequential manner, and in addition, a video signal of each color is applied to the liquid crystal display panel 4, in synchronization with this illuminating timing.

Each light (image light) modulated as a result of passing through the liquid crystal display panel 4 is projected by a projection lens 5, and displayed on a screen not shown.

A polarization conversion system may be provided on a side of the light exit surface of the rod integrator 3. The polarization conversion system in this case may be provided with a single PBS (polarizing beam splitter) corresponding to a size of the light exit surface of the rod integrator 3, a mirror provided parallel to a polarized light separating surface in the PBS, and a retardation plate provided on a side of a light exit side of the mirror or the PBS. However, in this case, a size of the light exit surface of the polarization conversion system is twice the size of the light exit surface of the rod integrator 3. Therefore, it is preferred that an aspect ratio of an entire shape of a light exit portion of the polarization conversion system is approximately equal to that of the liquid crystal display panel 4. In this case, if the aspect ratio of the liquid crystal display panel 4 is A:B, the aspect ratio of the light exit surface of the rod integrator 3 is A:B/2, for example. In addition, besides the aspect ratio of the light exit surface of the rod integrator 3, an aspect ratio of the light entrance surface may be A:B/2. In this case, an anamorphic optical system may be provided between the cross dichroic mirror 2 and the light entrance surface of the rod integrator 3 so as to adjust an aspect ratio of light fluxes. Needless to say, it may be possible to adopt a configuration in which the aspect ratio of the light exit surface of the rod integrator 3 is rendered A/2:B. In addition, the polarization conversion system may be provided on a light emission side of each LED light source 1. The polarization conversion system in this case may be provided with a single PBS corresponding to a size of a light emission portion of the LED light source 1, a mirror provided parallel to a polarized light separating surface of the PBS, and a retardation plate provided on the light exit surface side of the mirror or the PBS. As for these polarization conversion systems, besides the polarization conversion system formed of the single PBS, a polarization conversion system in which two PBSs are used for one LED may be used. In this case, the polarized light separating surfaces of the two PBSs are formed in a shape of "<" (gradually narrower toward the tip end, and wider toward the open end) seen from a lateral side, and the LED light source is arranged on the sharp-pointed side in the shape of "<". In addition, the two PBSs may be used for a plurality of LED light sources aligned in one line. In this case, the plurality of the LED light sources aligned in one line are arranged on the sharp-pointed side in the shape of the "<". Furthermore, as the polarized light separating surface, a dielectric multilayer or a wire grid, etc., may be used.

Figure 2:
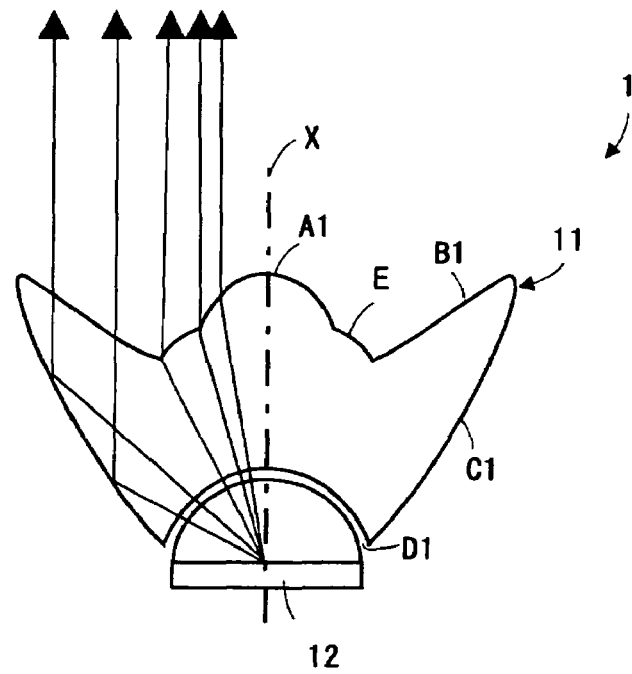
FIG. 2 is a sectional view showing an LED light source (illuminating device)

FIG. 2 is a sectional view of the LED light source 1. The LED light sources 1 is formed of one LED (light emitting diode) 12 in a shape of a hemisphere, and one angle control lens (converging element) 11. The angle control lens 11 is formed of a transparent material in a shape of a rotational symmetry with respect to an X axis, and includes a center convex curved surface area (light-emission area) A1, a peripheral curved surface area (light-emission area) B1, a peripheral curved surface reflection area C1, a center concave curved surface area (light-incidence area) D1, and a convex curved surface area E formed between the areas A1, B1. These curved surfaces have respectively different curvatures, and are formed in respectively different locations. In the concave curved surface area D1, there is provided the LED 12 having the primary optical axis thereof placed over the axis X. It is noted that in this embodiment, the concave curved surface area D1 is spherical, and the other curved surface areas are aspherical. Needless to say, it may be possible to adopt a configuration in which the concave curved surface area D1 is plane.

Out of lights emitted from the LED 12, the light advancing toward the convex curved surface area A1 is emitted in an anterior direction from the convex curved surface area A1 (in a direction intended to be emitted as a result of a light-emission angle being controlled). Out of the lights emitted from the LED 12, the light advancing toward the peripheral curved surface reflection area C1 is reflected by this area C1 and emitted in an anterior direction from the peripheral curved surface area B1 (in a direction intended to be emitted as a result of a light-emission angle being controlled). That is, a refraction factor of the angle control lens 1 and the curvatures of the curved surfaces are constructed so as to control the light-emission angle in such a manner.

Figure 27A:
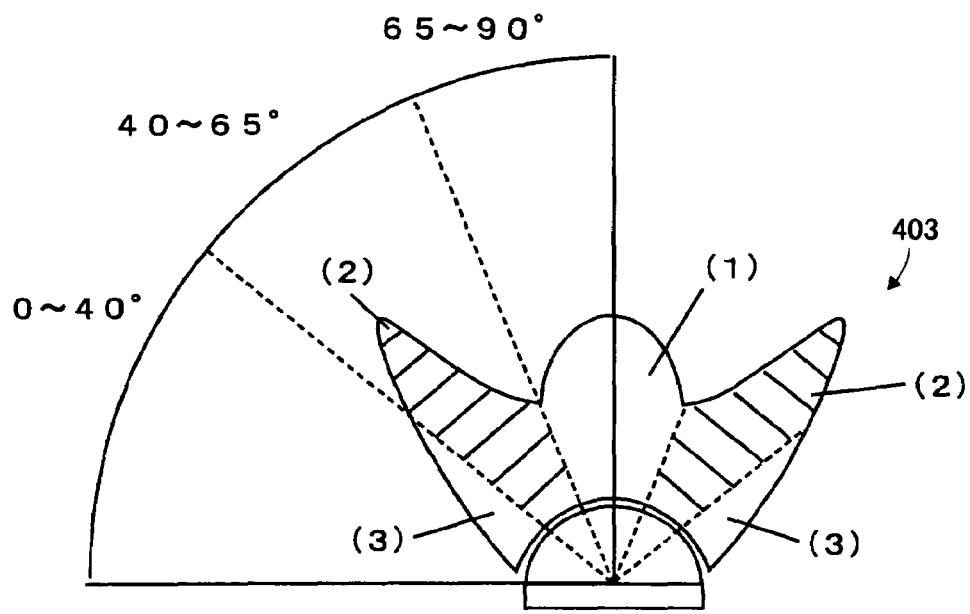
FIG. 27A is a descriptive diagram showing an angle range of three areas in the conventional LED light source.
Figure 27B:
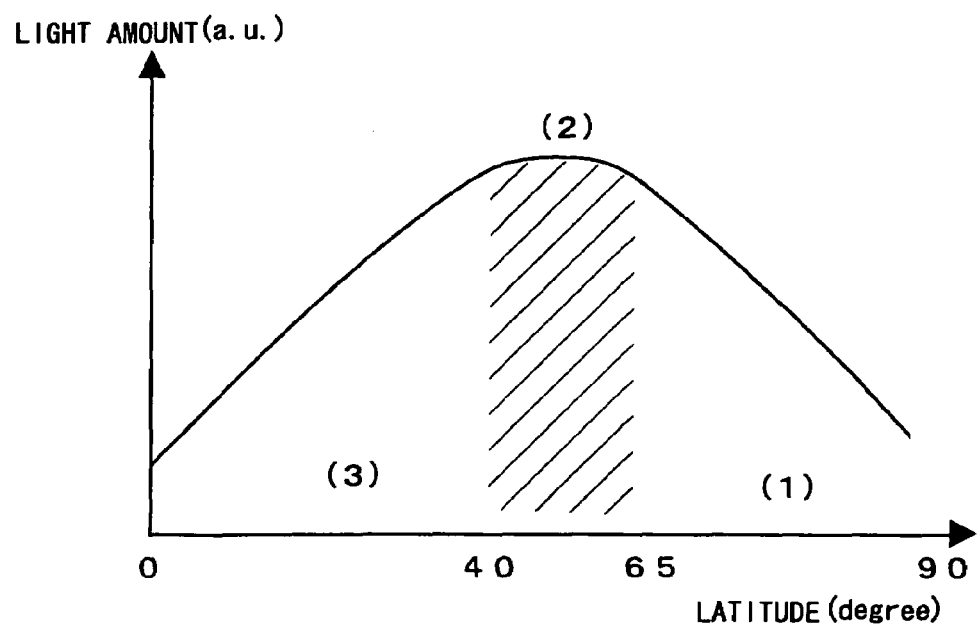
FIG. 27B is a graph showing a light amount of each range.
Figure 28:
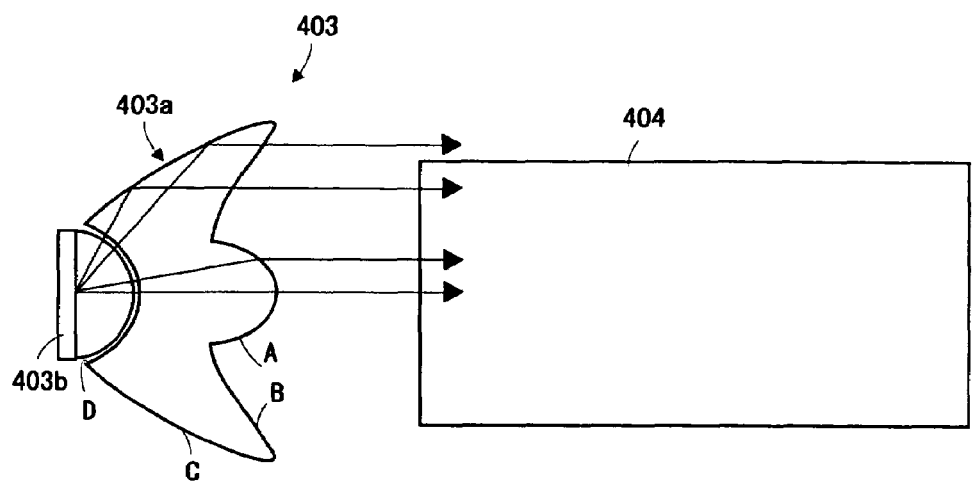
FIG. 28 is a descriptive diagram showing an illuminating device formed of the conventional LED light source and a rod integrator.
Figure 29:
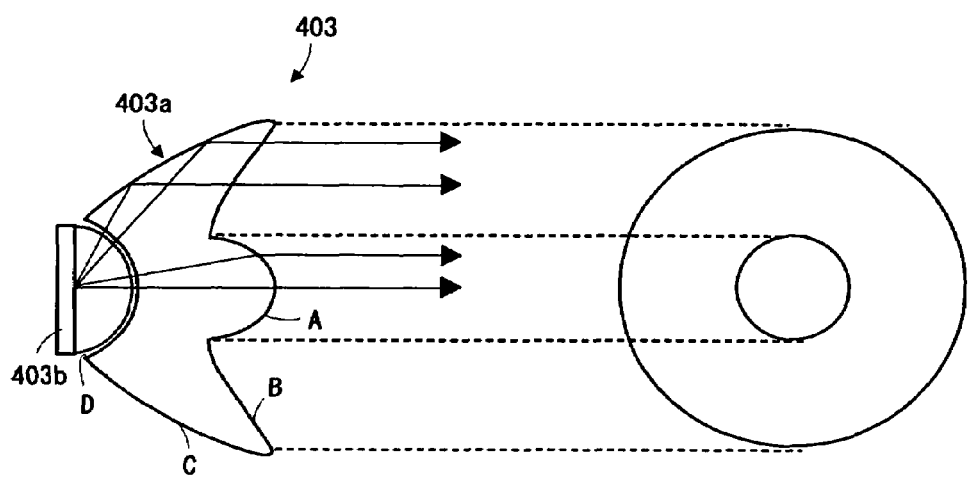
FIG. 29 is a descriptive diagram showing the conventional LED light source and light intensity distribution.

The convex curved surface area E is formed between the convex curved surface area A1 and the peripheral curved surface area B1. If the angle control lens 403a described in the Background of the invention is herein used for reference, the convex curved surface area E is formed in a position for receiving one portion of the light directly advancing in a direction of the peripheral curved surface area B (a zone between 60 degrees and 65 degrees in FIG. 27A, 27B, for example). That is, the convex curved surface area E is formed in the position for receiving peripheral direct incoming light from the LED 12, and is optically constructed such that this received incoming light is anteriorly emitted (in a direction intended to be emitted as a result of a light-emission angle being controlled).

Figure 3:
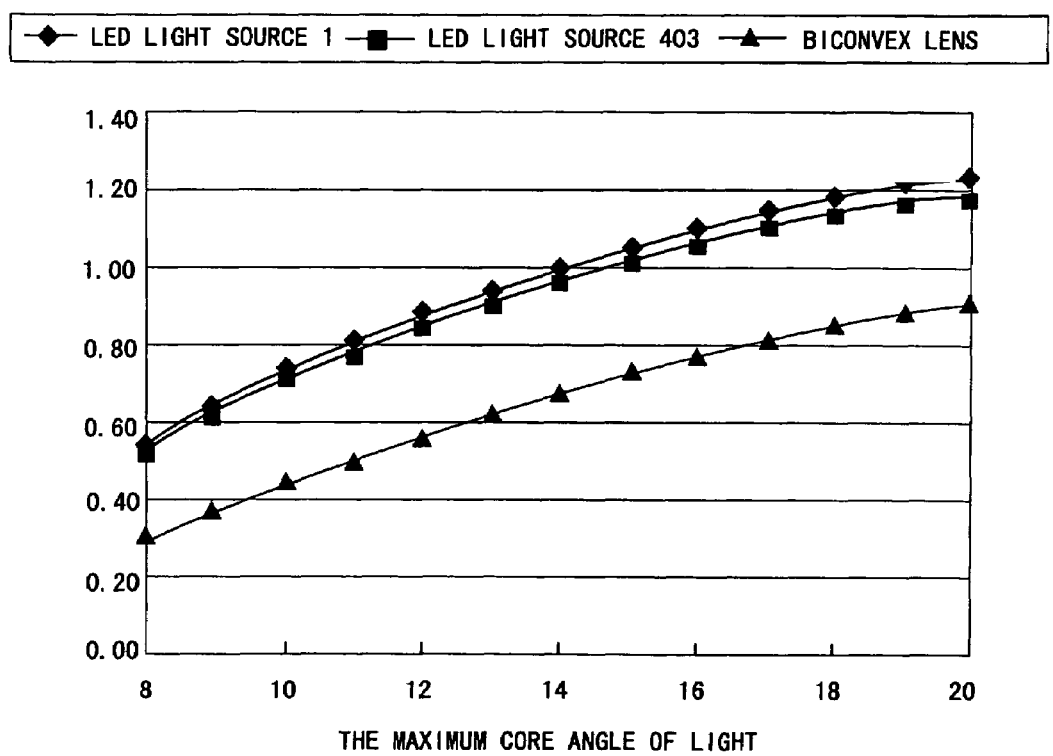
FIG. 3 is a graph showing a comparison between a light amount of the LED light source in FIG. 2 and that of a conventional light source.

FIG. 3 is a graph showing a relationship between an dispersion angle (the maximum core angle of light for the projection lens 5 to utilize) and an amount of the light emitted from the LED light source 1 (with the convex curved surface area E). It is noted that, for reference, the graph also shows a relationship between the dispersion angle and the amount of the light emitted from the LED light source provided with a biconvex lens, and a relationship between the dispersion angle and the amount of the light emitted from the LED light source provided with a conventional angle lens. As shown in FIG. 3, the light amount of the LED light source 1 is larger across the entire light-absorbing angle than that of the LED light source with the conventional structure. It is noted that in a case that the maximum core angle of the projection lens 5 is 14 degrees, and a value of the light amount of the LED light source 403 is 100, a value of approximately 105 (improved by 5%) is obtained in the LED light source 1, for example.

Figure 4A:
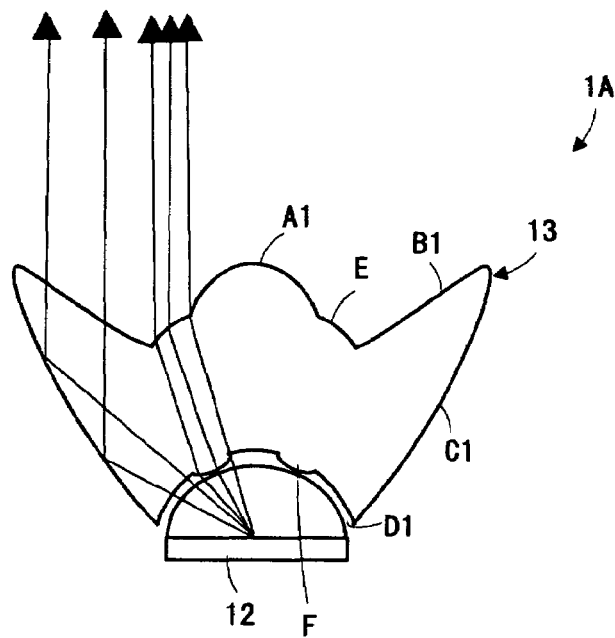
FIG. 4A is a sectional view showing an LED light source (illuminating device) of another embodiment of the present invention.

FIG. 4A is a sectional view showing an LED light source 1A. The LED light source 1A is formed of the LED 12 and an angle control lens (converging element) 13. Similar to the above-described angle control lens 11, the angle control lens 13 has the center convex curved surface area A1, the peripheral curved surface area B1, the peripheral curved surface reflection area C1, the center concave curved surface area D1, and the convex curved surface area E. In addition, the angle control lens 13 has a convex (in this embodiment, aspherical surface) light-incidence local area F.

The light-incidence local area F is on the concave curved surface area (light-incidence area) D1, and formed in a position to receive the light advancing in a direction of the peripheral curved surface area B1 and in a direction of the convex curved surface area E. In addition, the light-incidence local area F is optically constructed such that the light from the LED 12 is guided to the convex curved surface area E. Furthermore, the convex curved surface area E is optically constructed that the light from the light-incidence local area F is anteriorly emitted.

Figure 4B:
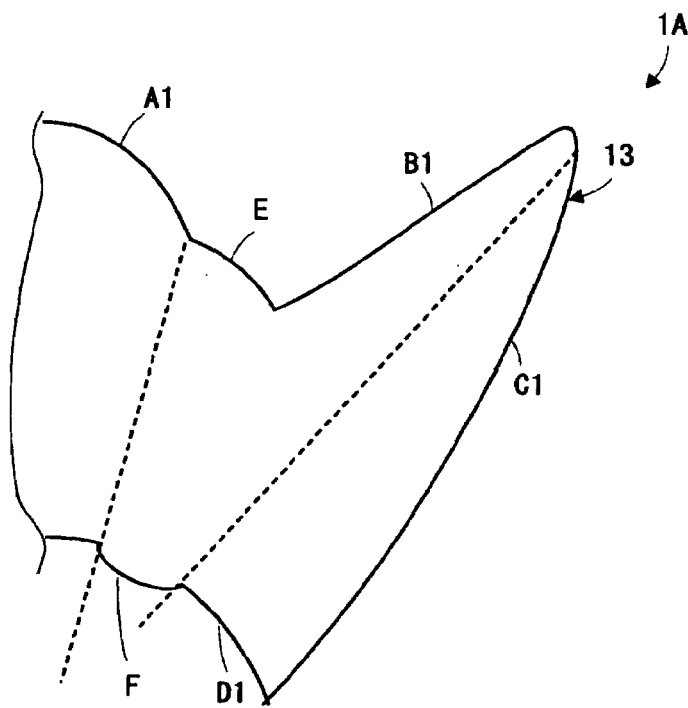
FIG. 4B is a partially enlarged view of FIG. 4A.

With the above-described LED light source 1A, LED emission light within a range indicated by dotted lines in FIG. 4B (a range between 40 degrees and 65 degrees in FIG. 27, for example: the angle shown in FIG. 27 is an example, and the LED light source 1A may have an angle range different from the above angle range) is incident upon the light-incidence local area F. Therefore, in the LED light source 1A, the light in the range indicated by the dotted lines in FIG. 4B (light in a range not possible to be guided in an anterior direction in the conventional LED light source 403) advances from the light-incidence local area F in the direction of the convex curved surface area E, and is emitted in the direction anterior to the angle control 13.

In the above description, the projection type video display apparatus 6 uses a transmissive liquid crystal display panel. However, this is not always the case. A reflective liquid crystal display panel may be used. In addition, instead of these liquid crystal display panels, a display panel separately driving micro mirrors serving as dots may be used. Furthermore, a solid light emitting element is not always the light-emitting diode (LED). An organic/inorganic electroluminescence, etc., may be used.

Figure 5:
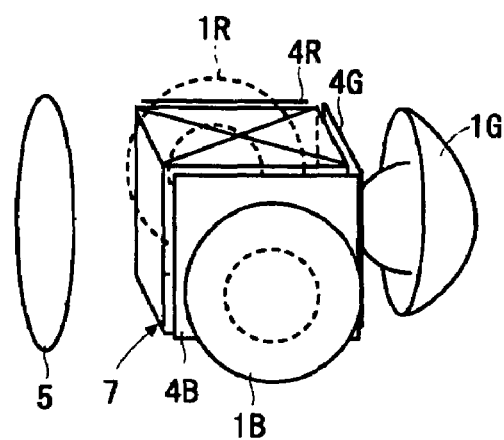
FIG. 5 is a descriptive diagram showing an optical system of a projection type video display apparatus of another embodiment of the present invention.
Figure 6:
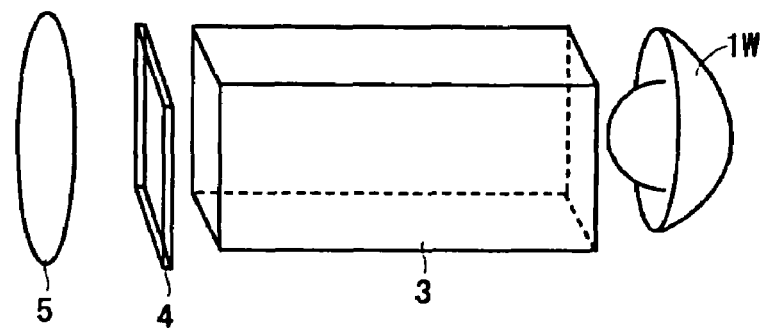
FIG. 6 is a descriptive diagram showing an optical system of a projection type video display apparatus of another embodiment of the present invention.

In addition, as the projection type video display apparatus, not only the configuration shown in FIG. 1, but also a configuration shown in FIGS. 5, 6, etc., may be adopted. A projection type video display apparatus in FIG. 5 is provided with a cross dichroic prism 7, which is a means for mixing image light of each color. On three light-incidence surfaces of the cross dichroic prism 7, a liquid crystal display panel 4R for red light, a liquid crystal display panel 4G for green light and a liquid crystal display panel 4B for blue light are arranged, and the LED light source 1R, the LED light source 1G, and the LED light source 1B are arranged in such a manner as to face each liquid crystal display panel. In addition, between each liquid crystal display panel and the LED light source 1, the rod integrator 3 may be provided. The projection type video display apparatus in FIG. 6 is provided with an LED light source 1W for emitting white light. The LED light source 1W has the same structure as that of the LED light source 1 or the LED light source 1A. The LED light source 1W may have structure in which an LED chip for emitting red light, an LED chip for emitting green light, and an LED chip for emitting blue light are brought close one another. The liquid crystal display panel 4 in FIG. 6 is a full-color display panel. In addition, in these configurations, a polarization conversion system may be appropriately provided.

Furthermore, in the illuminating devices described above, the rod integrator 3, which is a glass rod, is shown as the optical integrator. However, a rod integrator of which structure is hollow may be used. The rod integrator may be tapered in shape. In addition, an integrator lens formed of one pair of fly's eye lenses may be used as the optical integrator. The optical integrator may be omitted in a case that sufficient uniformity can be obtained in light fluxes emitted from the light source. In addition, the light source is not limited to the solid light-emitting element. Furthermore, instead of the projection lens, a projection-use curved surface mirror may be provided.

In addition, there is shown the configuration in which one LED light source 1 is provided as the light source for each color. However, a plurality of LED light sources 1 may be provided as the light source for each color. Furthermore, the concave curved surface area (light-incidence area) D1 is not always hemispherical, but is also plane, or flat-concave in shape. In addition, the LED 12, too, is not always provided with a hemispherical lens cover. Furthermore, instead of the cross dichroic prism, a cross dichroic mirror may be used.

Embodiment 2

Hereinafter, an embodiment of the present invention will be described based on FIGS. 7 to 14.

Figure 7:
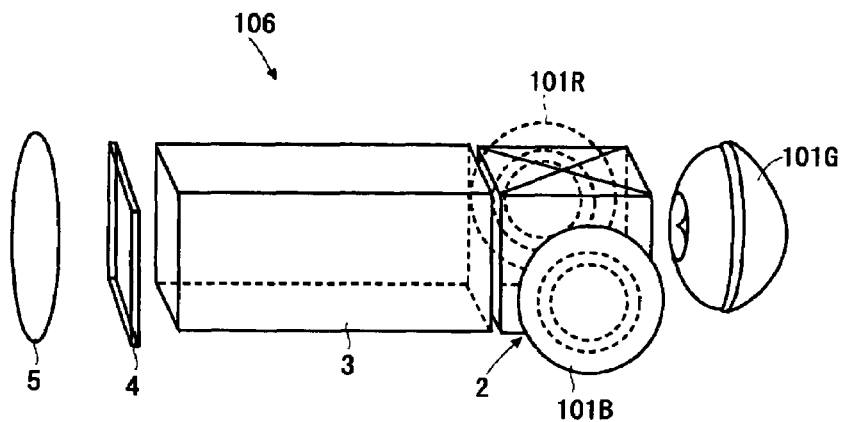
FIG. 7 is a descriptive diagram showing an optical system of a projection type video display apparatus of another embodiment of the present invention.

FIG. 7 shows an optical system of a single-panel projection type video display apparatus 106. This projection type video display apparatus 106 is provided with three LED light sources 101R, 101G, and 101B (hereinafter, a numeral "101" will be used for generally referring to each LED light source). The LED light source 101R emits red light, the LED light source 101G emits green light, and the LED light source 101B emits blue light. The LED light source 101G and a light entrance surface of the rod integrator 3 are arranged so as to face each other, with sandwiching the cross dichroic prism 2 therebetween, and the LED light source 101R and the LED light source 101B are arranged so as to face each other, with sandwiching the cross dichroic prism 2. That is, the LED light source 101R is arranged on a first light entrance surface of the cross dichroic prism 2, the LED light source 101B is arranged on a second light entrance surface, and the LED light source 101G is arranged on a third light entrance surface.

The light of each color emitted from each LED light source 101 is guided to the light entrance surface area of the rod integrator 3 by the cross dichroic prism 2. The rod integrator 3 is formed of transparent glass in a shape of a rectangular prism. An aspect ratio of at least a light exit surface of the rod integrator 3 is approximately equal to that of a liquid crystal display panel 4. The rod integrator 3 reflects light of each color from each LED light source 1 on a rod inner surface and guides each light of each color to the liquid crystal display panel 4, so that light intensity distribution of each color light is approximately rendered uniform on the liquid crystal display panel 4 (object to be illuminated).

The liquid crystal display panel 4 has structure with an RGB color filter, or structure without the RGB color filter. In a case of using the liquid crystal display panel 4 having the structure with the RGB color filter, all the LED light sources 101R, 101G, and 101B are illuminated at the same time, and white light is guided to the liquid crystal display panel 4. On the other hand, in a case of using the liquid crystal display panel 4 having the structure without the RGB color filter, the LED light sources 101R, 101G, and 101B are illuminated in a time-sequential manner, and in addition, a video signal of each color is applied to the liquid crystal display panel 4, in synchronization with this illuminating timing.

Each light (image light) modulated as a result of passing through the liquid crystal display panel 4 is projected by a projection lens 5, and displayed on a screen not shown.

A polarization conversion system may be provided on the light exit surface side of the rod integrator 3. The polarization conversion system in this case may be provided with a single PBS (polarizing beam splitter) corresponding to a size of the light exit surface of the rod integrator 3, a mirror provided parallel to a polarized light separating surface of this PBS, and a retardation plate provided on a side of a light exit surface of the mirror or the PBS. However, in this case, a size of the light exit surface of the polarization conversion system is twice the size of the light exit surface of the rod integrator 3. Therefore, it is preferable that an aspect ratio of a whole shape of the light exit surface of the polarization conversion system is approximately equal to that of the liquid crystal display panel. In this case, if an aspect ratio of the liquid crystal display panel is A:B, an aspect ratio of the light exit surface of the rod integrator 3 is A:B/2, for example. In addition, besides the aspect ratio of the light exit surface of the rod integrator 3, an aspect ratio of the light entrance surface thereof may be A:B/2. In this case, an anamorphic optical system may be provided between the cross dichroic mirror 2 and the light entrance surface of the rod integrator 3 so as to adjust an aspect ratio of light fluxes. Needless to say, it may be possible to adopt a configuration in which the aspect ratio of the light exit surface of the rod integrator 3 is rendered A/2:B. In addition, the polarization conversion system may be provided on a light emission side of each LED light source 101. The polarization conversion system in this case may be provided with a single PBS corresponding to a size of the light emission portion of the LED light source 101, a mirror provided parallel to a polarized light separating surface of the PBS, and a retardation plate provided on the light exit surface side of the mirror or the PBS. In these polarization conversion systems, besides the polarization conversion system formed of the single PBS, a polarization conversion system in which two PBSs are used for one LED may be used. In this case, the polarized light separating surfaces in the two PBSs are formed in a shape of "<" (gradually narrower toward the tip end, and wider toward the open end) seen from a lateral side, and the LED light source is arranged on a sharp-pointed side in the shape of "<". In addition, the two PBSs may be used for a plurality of LED light sources aligned in one line. In this case, the plurality of LED light sources aligned in one line are arranged on the sharp-pointed side in the shape of "<". Furthermore, as the polarized light separating surface, a dielectric multilayer or a wire grid, etc., may be used.

Figure 8:
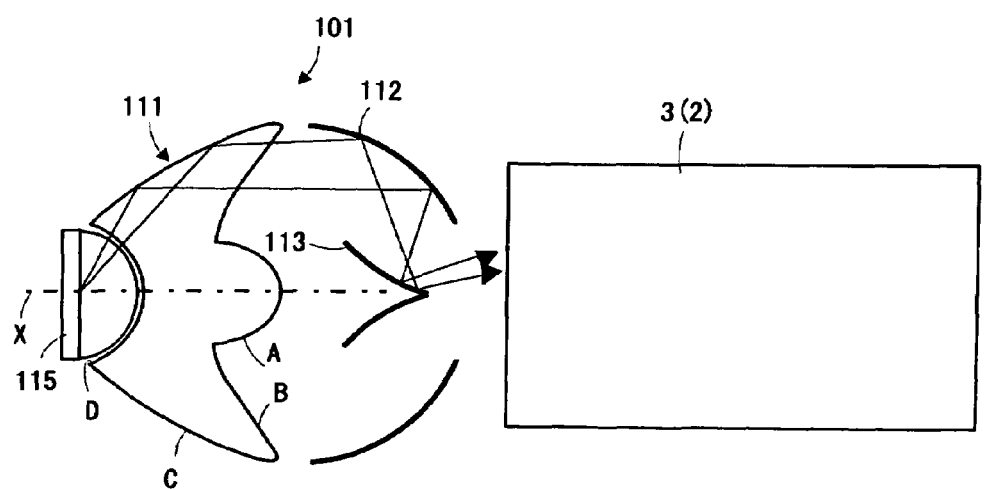
FIG. 8 is a sectional view showing an LED light source (illuminating device) in FIG. 7.

FIG. 8 is a sectional view of the LED light source 101. It is noted that for reference, FIG. 8 illustrates the rod integrator 3 (or, the cross dichroic prism 2), and shows an example of a relationship of sizes of these members.

The LED light source 101 is formed of an LED (light-emitting diode) 115 in a shape of a hemisphere, an angle control lens (first optical means) 111, a peripheral mirror (second optical means) 112, and a center mirror (third optical means) 113.

The angle control lens 111 is formed of a transparent material in a shape of a rotational symmetry with respect to an X axis, and includes a center convex curved surface area (light-emission area) A, a peripheral curved surface area (light-emission area) B, a peripheral curved surface reflection area C, and a center concave light-incidence area D. These curved surfaces have respectively different curvatures, and are formed in respectively different locations. In the concave light-incidence area D, there is provided the LED 115 including a primary optical axis thereof placed over the axis X. It is noted that in this embodiment, the concave light-incidence area D is a concave sphere in shape, and the other curved surface areas are aspherical.

Out of lights emitted from the LED 115, the light advancing toward the convex curved surface area A is emitted in an anterior direction from the convex curved surface area A (in a direction intended to be emitted as a result of a light-emission angle being controlled). Out of the lights emitted from the LED 115, the light advancing toward the peripheral curved surface reflection area C is reflected by this area C and emitted in an anterior direction from the peripheral curved surface area B (in a direction intended to be emitted as a result of a light-emission angle being controlled). That is, a refraction factor of the angle control lens 111 and the curvatures of the curved surfaces are constructed so as to control the light-emission angle in such a manner.

The peripheral mirror 112 is provided in a position to receive peripheral emission light from the angle control lens 111, and guides (reflects) the peripheral emission light in a direction approximately crossing the axis X of the angle control lens 111. Although the peripheral mirror 112 is in a shape of an aspherical dome (there exists an aperture at the center), the peripheral mirror 112 may be in a shape of a spherical dome (that is, a reflection surface of the peripheral mirror 112 is curved in shape toward a direction in which the light advances). In addition, a sectional shape of the peripheral mirror 112, which is cut by a surface parallel to the axis X, may be in a shape of a trapezoid (the reflection surface of the peripheral mirror 112 is linear in shape toward a direction in which the light advances).

The center mirror 113 is provided near the center portion of the angle control lens 111, and is so formed as to reflect the peripheral emission light reflected by the peripheral mirror 112 and to guide the reflected light in a direction anterior to the angle control lens 111. Although the center mirror 113 has an aspherical, approximately conical shape, the center mirror 113 may be spherical. In addition, the sectional shape of the center mirror 113, which is cut by a surface parallel to the axis x, may be triangle.

The light emitted from a peripheral side of the angle control lens 111 is reflected by the peripheral mirror 112 and is guided in a direction approximately crossing the axis X, that is, in a direction where the center mirror 113 is located. In addition, the center mirror 113 reflects the light from the peripheral mirror 112. The reflected light is guided in a direction anterior to the angle control lens 111, passes through the aperture of the peripheral mirror 112, and reaches the cross dichroic prism 2.

It is noted that in a configuration example of FIG. 8, the light emitted from the center side of the angle control lens 111 is shielded by the center mirror 113.

Figure 9:
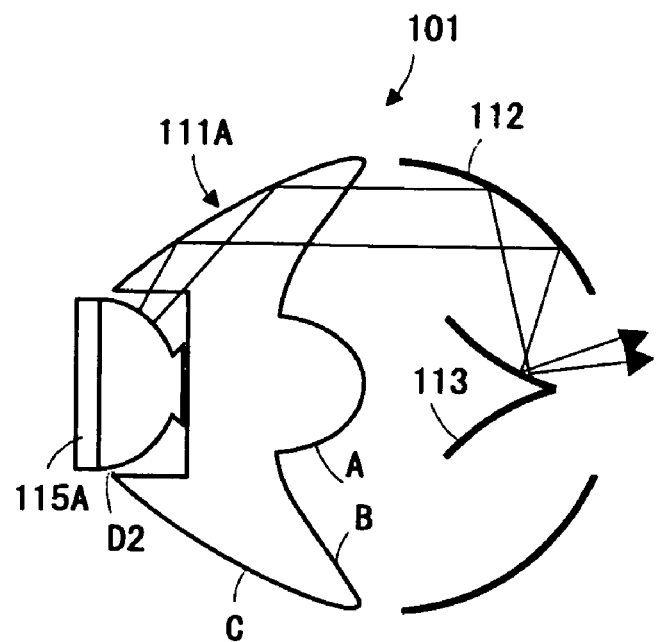
FIG. 9 is a sectional view showing another configuration example of the LED light source (illuminating device)

An LED light source 101 shown in FIG. 9 is the same LED light source as in the configuration in FIG. 8 except that instead of the LED 115 and the angle control lens 111, an LED 115A and an angle control lens 111A are provided, respectively. The LED 115A is a side-emission LED, and guides the emission light from the LED chip to a lateral side. A concave light-incidence area D2 of the angle control lens 111A is in a shape of a concave rectangular seen from the lateral side. With the LED light source 101 shown in FIG. 9, most of the light emitted from the LED 115A is emitted from the peripheral of the angle control lens 111A, so that it is possible to prevent disadvantages, for example, such as light shielding by the center mirror 113.

Figure 10:
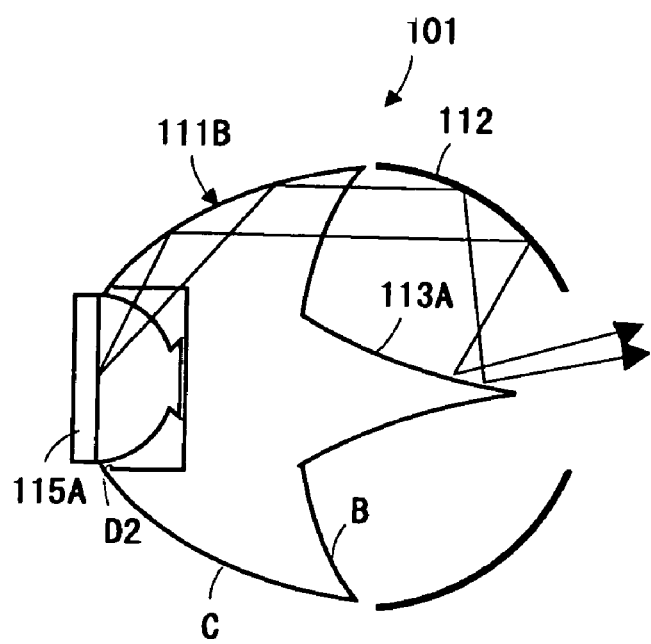
FIG. 10 is a sectional view showing another configuration example of the LED light source (illuminating device)

An LED light source 101 shown in FIG. 10 is the same as in the configuration in FIG. 8 except that instead of the LED 115 and the angle control lens 111, an LED 115A and an angle control lens 111B are provided, respectively, and omits the center mirror 113. A concave light-incidence area D2 of the angle control lens 111B is in a shape of a concave rectangular seen from a lateral side. In addition, the angle control lens 111B has an aspherical and approximately conical shaped portion 113A at the center. An outer peripheral portion (curved surface) of this approximately conical shaped portion 113A serves as a mirror surface, and as a result, a function similar to that of the center mirror 113 is obtained. As a consequence, it becomes possible to realize omitting of the center mirror 113.

Figure 11:
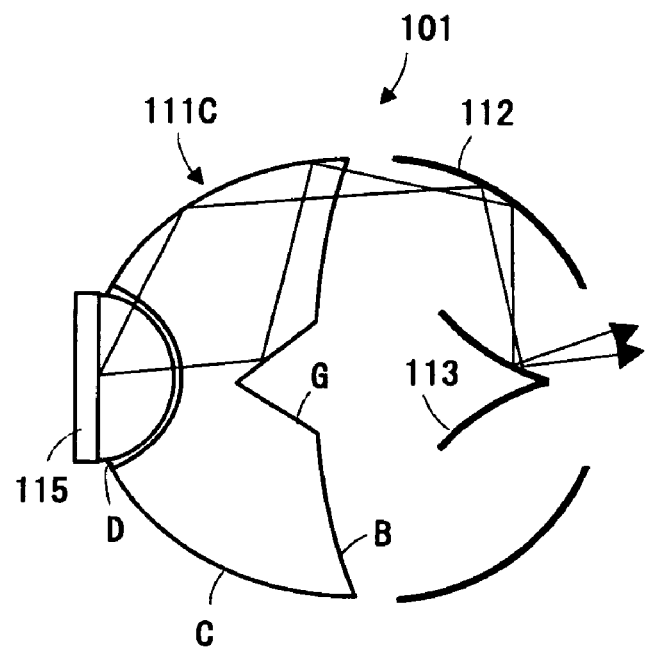
FIG. 11 is a sectional view showing another configuration example of the LED light source (illuminating device)

An LED light source 101 shown in FIG. 11 is the same as in the configuration in FIG. 8 except that instead of the angle control lens 111, an angle control lens 111C is provided. In a center portion of a light exit surface of the angle control lens 111C, there exits a concave reflection area G in a shape of an approximate cone. Out of the lights emitted from the LED 115, the light of the center side is reflected by the concave reflection area G, and advances to the peripheral curved surface reflection area C. This reflected light is reflected by this area C and anteriorly emitted from the peripheral side of the angle control lens 111C. Therefore, with the LED light source 101 shown in FIG. 11, most of the lights emitted from the LED 115 are emitted from the peripheral side of the angle control lens 111C, so that it becomes possible to prevent disadvantages, for example, such as light shielding by the center mirror 113.

Figure 12:
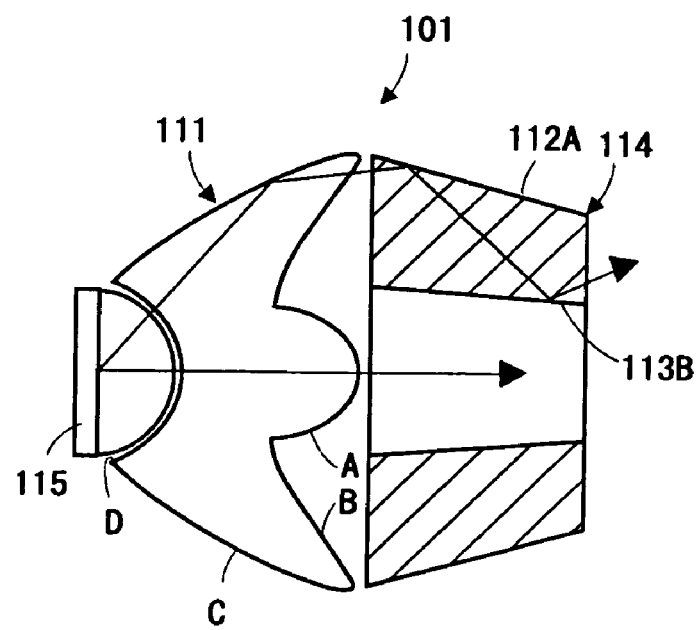
FIG. 12 is a sectional view showing another configuration example of the LED light source (illuminating device)

An LED light source 101 shown in FIG. 12 is the same as in the configuration of FIG. 8 except that instead of the peripheral mirror 112 and the center mirror 113, an optical transparent member 114 made of glass, for example, is provided. The optical transparent member 114 is tapered in shape (gradually thinner in the light-advancing direction), and has a center hollow portion (a center axis of the hollow portion is parallel to the axis X). A size of the hollow portion is approximately the same as a diameter of the convex curved surface area A. A thickness (thickness of the glass) and an inclination angle of the optical transparent member 114 are set such that the light emitted from the peripheral side of the angle control lens 111 is guided in a direction anterior to the angle control lens 111. An outer peripheral surface 112A of the optical transparent member 114 functions similarly to the peripheral mirror 112 due to total reflection effect of light, and an inner peripheral surface 114B, too, functions similarly to the center mirror 113 due to the total reflection effect of light. With the LED light source 101 shown in FIG. 12, out of the lights emitted from the LED 115, the light of the center side passes through the hollow portion, so that utilization efficiency of light is further improved compared to a configuration in which the light of the center portion is shielded. It is noted that provision of an aperture in the center portion of the center mirror, too, makes it possible to obtain a similar configuration in which the light of the center side is utilized.

In a sectional shape of the optical transparent member 114, which is cut by a surface parallel to the axis X, the sectional shapes of the outer peripheral surface 112A and the inner peripheral surface 113B are linearly tapered. Besides such the linearly tapered shape, the sectional shapes of the outer peripheral surface 112A and the inner peripheral surface 113B may be formed in a shape of a dome (the outer peripheral surface 112A and the inner peripheral surface 113B form curved surfaces with respect in a direction to which the light advances). In addition, a sectional shape of the optical transparent member 114, which is cut by a surface vertical to the axis x, may be formed not only in a shape of a circular frame (in a shape of a donut), but also in a shape of a square frame. Similarly, the sectional shapes of the above-described peripheral mirror 112 and the center mirror 113 may be in a shape of a square. Furthermore, arranging of a transparent member (transparent resin, etc.) in a light emission aperture of the peripheral mirror 112, and in addition, supporting the center mirror 113 by this transparent member make it possible to unify the peripheral mirror 112 and the center mirror 113. In addition, it is also possible to adhere the center mirror 113 to the concave curved surface area A of the angle control lens 111.

In the above description, the projection type video display apparatus 6 uses a transmissive liquid crystal display panel. This is not always the case. A reflective liquid crystal display panel may be used. Instead of these liquid crystal display panels, it may be possible to use a display panel for separately driving micro mirrors serving as dots. In addition, the solid light-emitting element is not limited to the light-emitting diode (LED). An organic/inorganic electroluminescence, etc., may be used.

Figure 13:
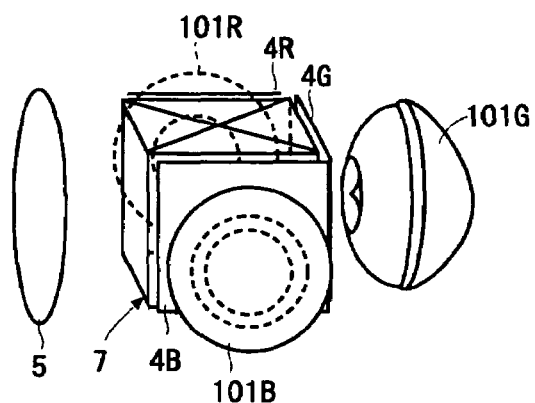
FIG. 13 is a descriptive diagram showing an optical system of a projection type video display apparatus of an embodiment of the present invention.
Figure 14:
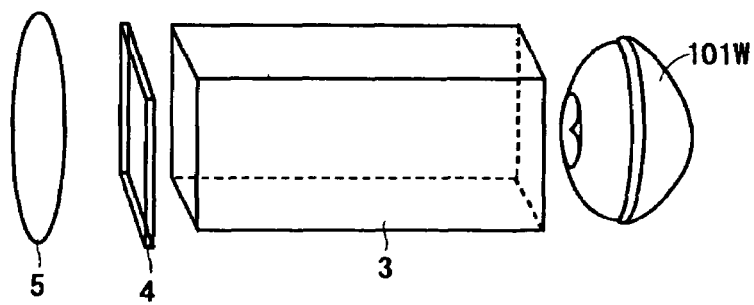
FIG. 14 is a descriptive diagram showing an optical system of a projection type video display apparatus of an embodiment of the present invention.

In addition, as the projection type video display apparatus, besides the configuration shown in FIG. 7, configurations shown in FIGS. 13, 14, and other configurations may be adopted. A projection type video display apparatus in FIG. 13 is provided with a cross dichroic prism 7, that is, a means for mixing image light of each color. On three light-incidence surfaces of the cross dichroic prism 7, a liquid crystal display panel 4R for red light, a liquid crystal display panel 4G for green light, and a liquid crystal display panel 4B for blue light are arranged. The LED light source 101R, the LED light source 101G, and the LED light source 101B are arranged in such a manner as to face each liquid crystal display panel. It is noted that an optical integrator such as the rod integrator 3, etc., may be provided between each liquid crystal display panel and the LED light source 101. A projection type video display apparatus in FIG. 14 is provided with an LED light source 101W for emitting white light. The LED light source 101W has structure shown in FIGS. 8 to 12. The LED light source 101W may have structure in which an LED chip for emitting red light, an LED chip for emitting green light, and an LED chip for emitting blue light are brought close one another. A liquid crystal display panel 4 shown in FIG. 14 is a full-color display panel. In addition, in these configurations, a polarization conversion system may be appropriately provided.

Furthermore, in the illuminating devices described above, the rod integrator 3, which is a glass rod, is shown as the optical integrator. However, a rod integrator of which structure is hollow may be used. The rod integrator may be tapered in shape. In addition, an integrator lens formed of one pair of fly's eye lenses may be used as the optical integrator. The optical integrator may be omitted in a case that sufficient uniformity can be obtained in light fluxes emitted from the light source. In addition, the light source is not limited to a solid light-emitting element. Furthermore, instead of the projection lens, a projection-use curved mirror may be provided.

In addition, there is shown the configuration in which one LED light source 101 is provided as the light source of each color. However, a plurality of LED light sources 101 may be provided as the light source of each color. In addition, instead of the cross dichroic prism, a cross dichroic mirror may be used.

It is noted that it may be possible to adopt a light source formed of the angle control lens having the areas E, F shown in FIG. 2 or FIG. 4, the peripheral mirror (second optical means) 112 shown in FIG. 8, etc., and the center mirror (third optical means) 113.

Embodiment 3

Hereinafter, a description will be made regarding an illuminating device related to another embodiment, and a projection type video display apparatus using this illuminating device.

Embodiment 3-1

Figure 15:
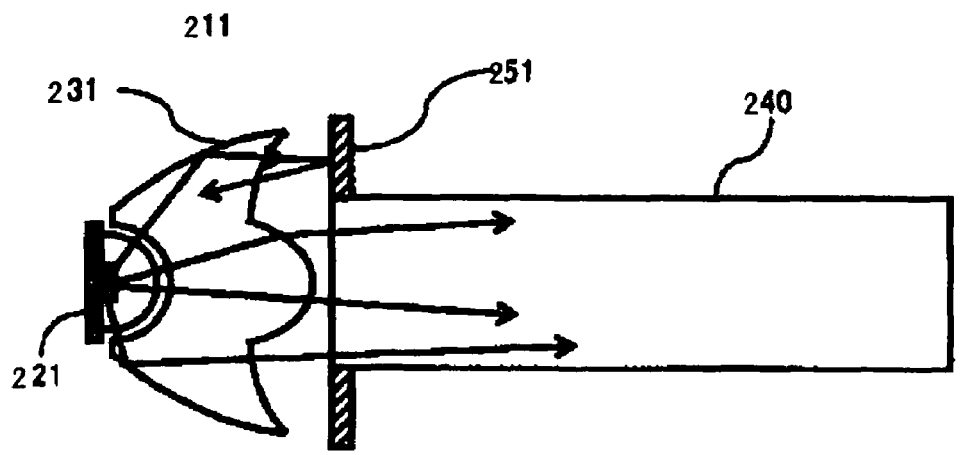
FIG. 15 is a descriptive diagram showing an illuminating device of an embodiment of the present invention.

FIG. 15 shows an illuminating device 321. The illuminating device 321 is provided with a light source 211 (the light source 211 is provided with an LED 221 with a mold lens, for example), a rod integrator 240, that is, an optical integrating means, and a first reflection member (a metallic mirror, etc., for example) 251 for guiding in a direction of the light source light not incident upon the rod integrator 240. In addition, the light source 211 is provided with an angle control lens (converging element) 231 for controlling a direction of emission light of the LED 221 within a predetermined angle range.

Figure 16:
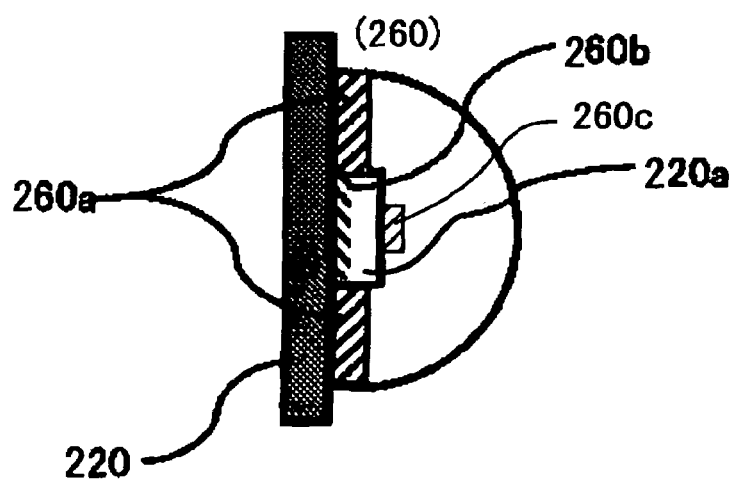
FIG. 16 is a descriptive diagram showing a configuration example of the light source.

As FIG. 16 shows, the LED 221 is provided with an LED chip 220a on a substrate 220, and emits almost radial diffusion light. In addition, the LED 221 is provided with a second reflection member 260. The second reflection member 260 is formed of a reflection area 260a arranged around the LED chip 220a, a reflection area 260c arranged on a front surface side (light emission side) of the LED chip 220a, and a reflection area 260b arranged on a rear surface side of the LED chip 220a. Each reflection area is formed of a metal film, etc., for example. The second reflection member 260 may be provided with all of these three reflection areas, or formed of any one of, or two of the reflection areas.

Figure 17:
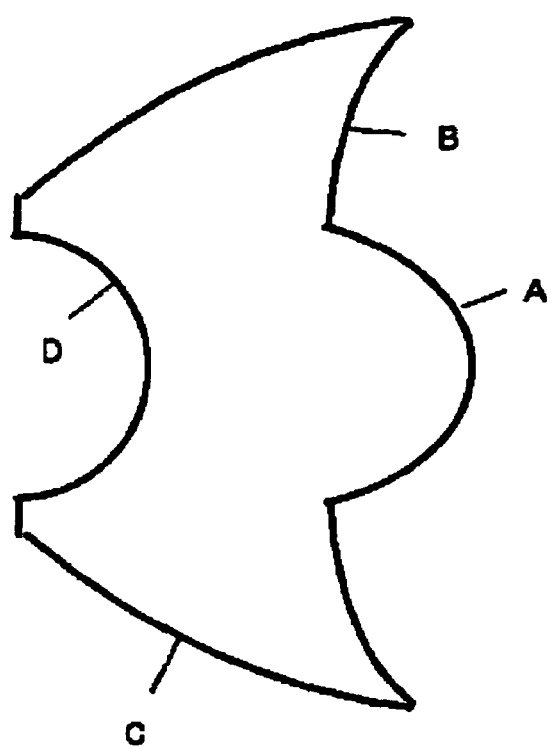
FIG. 17 is a descriptive diagram showing one example of a converging element.

The angle control lens 231 is formed of a transparent material, and provided on a light emission side of the LED 221. As FIG. 17 shows, the angle control lens 231 has a center convex curved surface area (center light-emission area) A, a peripheral curved surface area (peripheral light-emission area) B, a peripheral curved surface reflection area C, and a center concave light-incidence area D (light-incidence area). These curved surfaces have respectively different curvatures (these curved surfaces are spherical or aspherical), and are formed in respectively different locations.

Out of approximate diffusion lights emitted form the LED 221, the light incident upon the convex curved surface area A (component light having a low dispersion angle) is refracted by the convex curved surface area A, and anteriorly emitted. The light incident upon the peripheral curved surface reflection area C (component light of a high dispersion angle) is reflected by the reflection area C, and anteriorly emitted from the peripheral curved surface area B. That is, a refraction factor of the angle control lens 231 and the curvatures of the surfaces are constructed so as to control the light-emission angle in such a manner.

The light of which advancing direction is controlled by the angle control lens 231 is incident upon the rod integrator 240. An area of a light exit surface of the angle control lens 231 (light emission range) is larger than that of a light entrance surface of the rod integrator 240. Out of the emission lights from the angle control lens 231, the light not capable of being incident upon the light entrance surface of the rod integrator 240 is reflected (returned) in a direction of the angle control lens 231 by the first reflection member 251 provided around the light entrance surface of the rod integrator 240.

The light reflected by the first reflection member 251 passes through the angle control lens 231 once again, and is incident upon the LED 221. The returned light incident upon the LED 221 is reflected by the second reflection member 260, and emitted from the light exit surface of the angle control lens 231 after being incident upon the angle control lens 231 once again. The re-emission light from the angle control lens 231 is divided into light to be guided to the light entrance surface of the rod integrator 240 and light once again to be reflected by the first reflection member 251.

As described above, the peripheral light emitted from the angle control lens 231 by the first reflection member 251 and the second reflection member 260 is utilized once again, and as a result, a larger amount of the light from the LED 221 is guided to the light entrance surface of the rod integrator 240. That is, in a configuration using a light guide means of which light entrance surface is smaller than a light emission range of the light source it becomes possible to use the light from the light source more efficiently.

Figure 24:
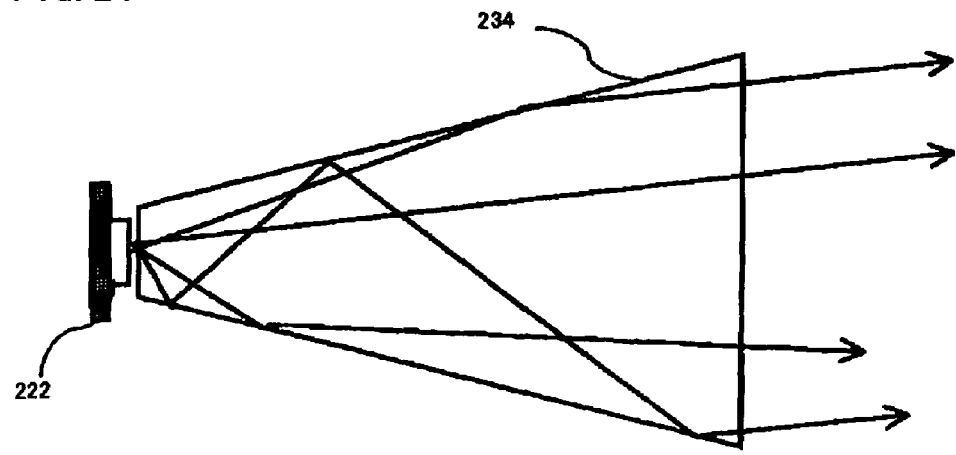
FIG. 24 is a descriptive diagram showing another example of the converging element of the present invention.
Figure 25A:
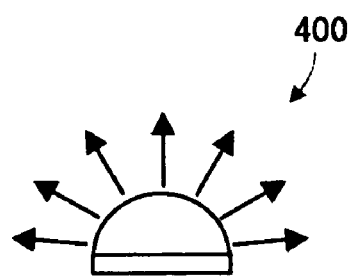
FIG. 25A, FIG. 25B, and FIG. 25C are sectional views showing conventional LED light sources, respectively.
Figure 25B:
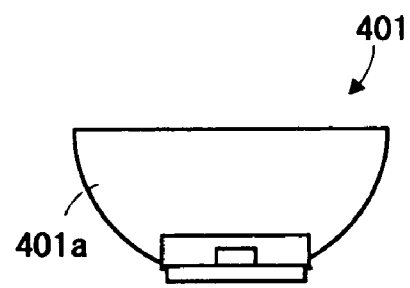
Figure 25C:
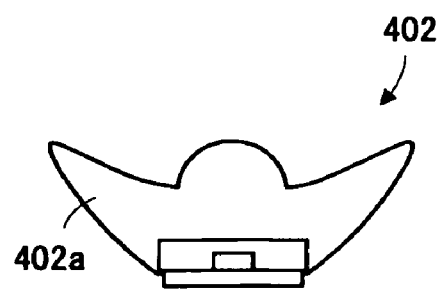
Figure 26:
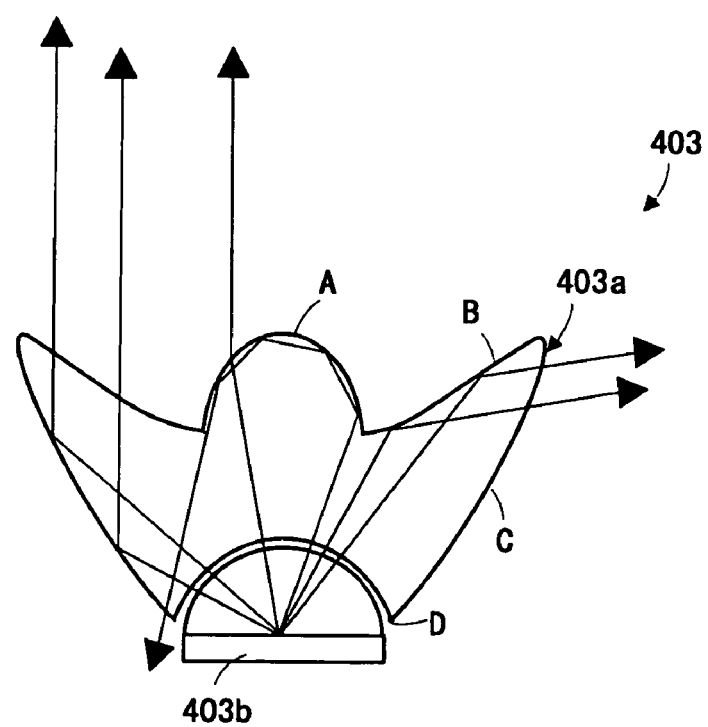
FIG. 26 is a sectional view showing a conventional LED light source.

As the converging element, a tapered rod integrator 234 shown in FIG. 24 may be used. In this case, the lights repeat reflections and total reflections on a side surface (reflection surface) of the rod having a tapered angle. As a result, a diffusion angle of the emission light of the light source 222 is rendered small.

Embodiment 3-2

Figure 18:
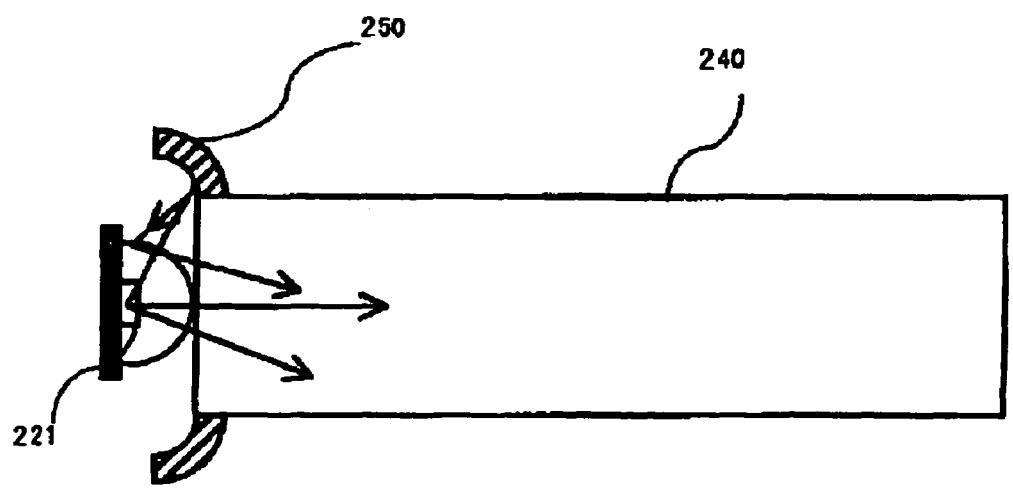
FIG. 18 is a descriptive diagram showing another embodiment of the illuminating device of the present invention.

FIG. 18 is a descriptive diagram showing another embodiment of an illuminating device (illuminating device 320) of the present invention. A light source in this illuminating device 320 is not provided with an angle control lens (converging element). Out of lights emitted from the LED 221, the light not guided to the light entrance surface of the rod integrator 240 is reflected by the first reflection member 250 provided around the light entrance surface, and incident upon the second reflection member 260 (see FIG. 16). The light re-reflected by the second reflection member 260 is guided to the light entrance surface of the rod integrator 240, so that it is possible to efficiently use the emission light from the LED 221.

As FIG. 18 shows, besides the shape of a plane surface, the first reflection member 250 may be in a shape of a curved surface. That is, the first reflection member 250 may be in any shape capable of efficiently returning the received light to the second reflection member 260.

Embodiment 3-3

Figure 19:
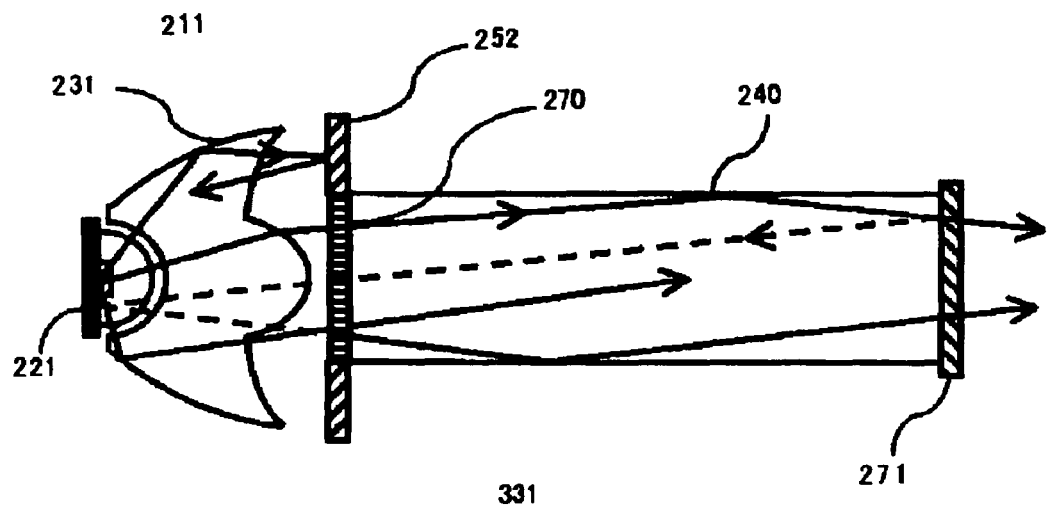
FIG. 19 is a descriptive diagram showing another embodiment of the illuminating device of the present invention.

FIG. 19 is a descriptive diagram showing another illuminating device 331. The illuminating device 331 is capable of emitting light of which polarization is directed to a common direction. The illuminating device 331 is provided with the LED 221, the rod integrator 240, that is, an optical integrating means, the angle control lens 231 for controlling a diffusion angle of the emission light from the LED 221, and a first reflection member 252 for guiding to the LED 221 light deflecting to an outside of the light entrance surface of the rod integrator 240. Furthermore, the illuminating device 331 is provided with a ¼λ plate 270 on the light entrance surface of the rod integrator 240, and a reflective polarizer 271 on the light exit side of the rod integrator 240.

Out of lights emitted from the angle control lens 231, the light guided to the light entrance surface of the rod integrator 240, after passing through the ¼λ plate 270, repeats reflections within the rod integrator 240, and reaches the reflective polarizer 271. Out of the incident light, the reflective polarizer 271 reflects incident light of which polarization component is directed in a certain direction, and transmits incident light of which polarization component is directed in other directions. The reflective polarizer 271 may be formed of a wire grid polarizer, a photonic crystal, etc., for example. In addition, the ¼λ plate 270 is an optical element capable of shifting a wavelength of a phase of the transmitting light by ¼ with respect to an axis of the retardation plate, and is used for a conversion from a linear polarization to a circular polarization, or vice versa. There is a certain linearly-polarized light of which polarization direction is rotated by 90 degrees after passing through the ¼λ plate twice.

Out of lights incident upon the reflective polarizer 271, a certain polarization component, such as P-polarized light, for example, is transmitted, and another polarization component such as S-polarized light, for example, is reflected. The reflected S-polarized light advances within the rod integrator 240 once again. The linearly-polarized light passing through from within the rod integrator 240 to the ¼λ plate 270 is converted into the circularly-polarized light. The circularly-polarized light is incident upon the angle control lens 231 once again. Light reflected by the second reflection member 260 within the LED 221 reaches the light entrance surface of the rod integrator 240 once again, and passes through the ¼ λ plate 270. As a result, a direction of polarization of this light is rotated by 90 degrees with respect to the original direction of polarization. Consequently, this light is converted into a polarization component capable of passing through the reflective polarizer 271. As a result, the light of which polarization direction is redirected to the common direction is emitted from the rod integrator 240.

With the above configuration, even in a case of using the light guide means of which light entrance surface is smaller than a radiating range of the light from the light source, it becomes possible to more efficiently use the emission light from the light source. In addition, it is possible to realize illumination by the light of which polarization direction is redirected to the common direction by the polarization conversion.

Furthermore, if a shape of the angle control lens 231 may be changed such that a larger amount of the light reflected by the first reflection member 252 arranged around the rod integrator 240 and re-reflected by the second reflection member 260 of the light source is incident upon an incident aperture of the rod integrator 240, it is possible to further improve utilization efficiency of the light.

Figure 20:
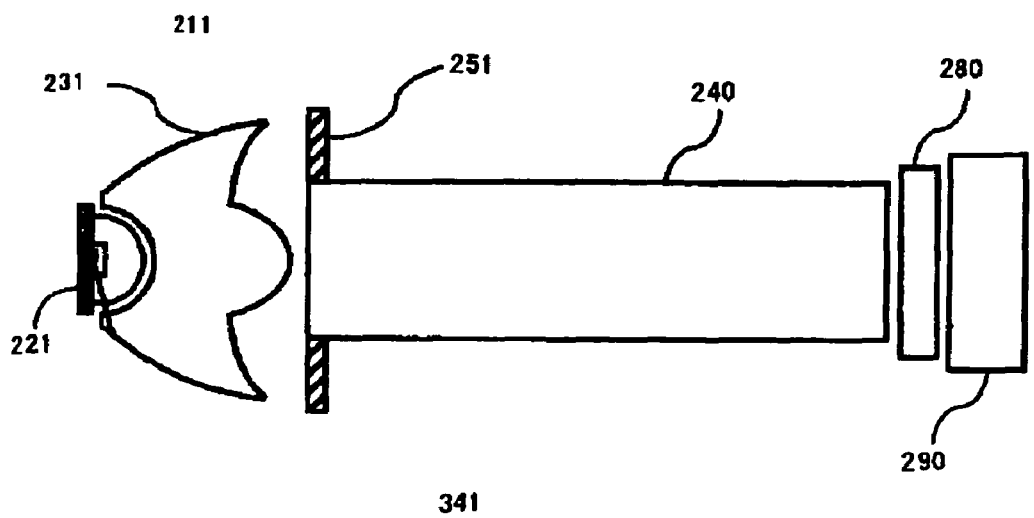
FIG. 20 is a descriptive diagram showing another embodiment of the illuminating device of the present invention.

FIG. 20 shows a descriptive diagram showing a projection type video display apparatus 341 using the illuminating device 321 shown in FIG. 15. Light emitted from the rod integrator 240 is optically modulated by a liquid crystal display panel 280, and the optically modulated light (image light) is projected on a screen not shown via a projection optical system formed of a projection lens 290, etc.

The liquid crystal display panel 280 has structure with the RGB color filter, or structure without the RGB color filter.

In a case of using the liquid crystal display panel having the structure with the RGB color filter, the LED 221 has an LED chip for emitting light of each RGB (red, green, blue) color onto the substrate 220, or has an LED chip for emitting white light. The white light is guided to the liquid crystal display panel 280 by continuously illuminating the LED 221.

In a case of using the liquid crystal display panel having the structure without the RGB color filter, the LED 221 has LED chips each of which separately emits each light of RGB color onto the substrate 220, and these LED chips are brought close one another. The LED is illuminated in a time-sequential manner by an illumination control circuit not shown. In synchronization with timing of the time-diving illumination of each color, a liquid crystal display panel driver not shown applies an image signal of each color to the liquid crystal display panel 280 in a time-sequential manner.

In addition, the above example describes a configuration in which a cuboid rod integrator 240 is provided. However, instead of the rod integrator 240, a tapered rod integrator having a light entrance surface and a light exit surface different in size may be used. A tapered rod integrator having an area of the light exit surface larger than that of the light entrance surface may preferably be used.

It is noted that although there is shown a configuration in which a light-emitting diode (LED), that is, the solid light source, is used as the light source 211, this is not always the case.

Embodiment 3-4

Figure 21:
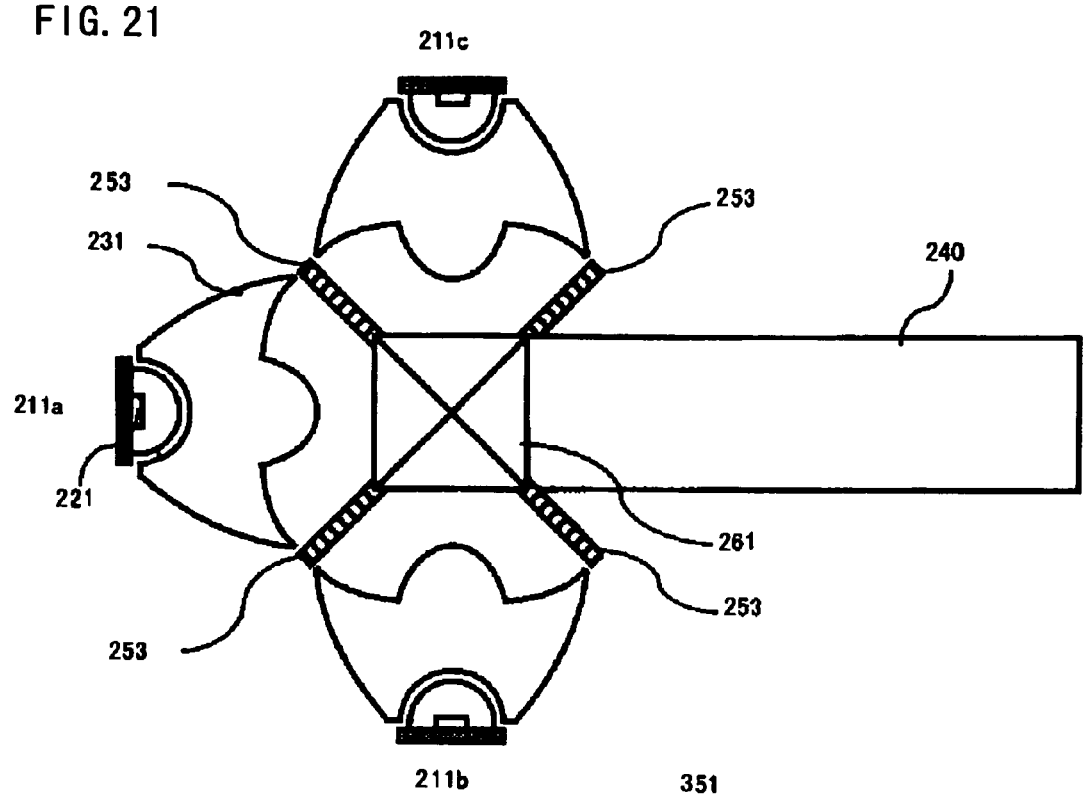
FIG. 21 is a descriptive diagram showing another embodiment of the illuminating device of the present invention.
Figure 22:
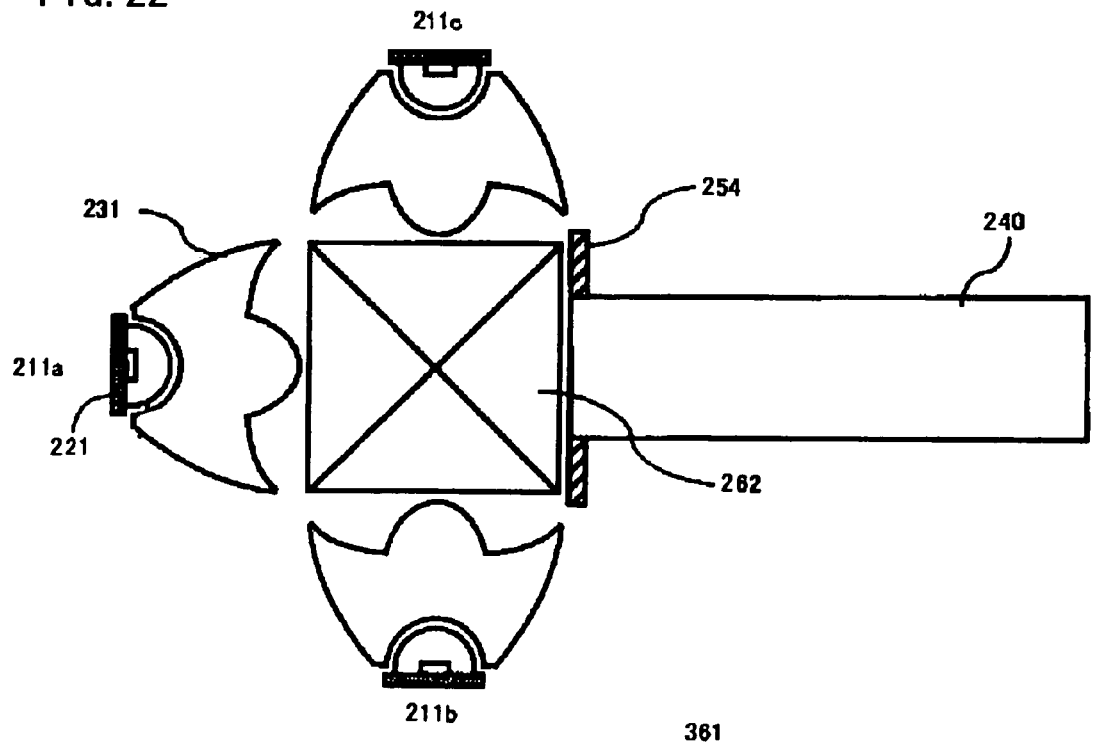
FIG. 22 is a descriptive diagram showing another embodiment of the illuminating device of the present invention.
Figure 23:
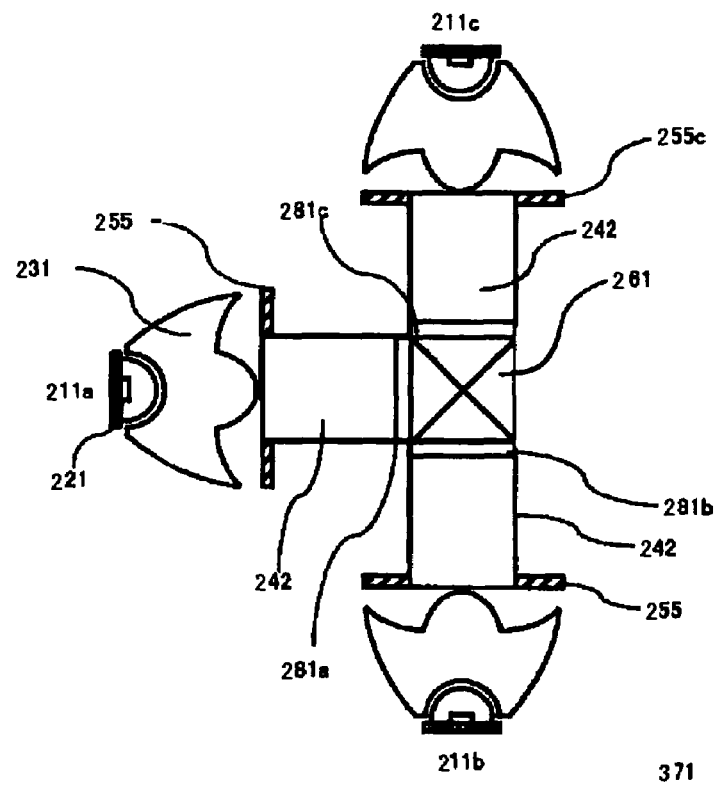
FIG. 23 is a descriptive diagram showing another embodiment of the illuminating device of the present invention.

FIG. 21 to FIG. 23 are descriptive diagrams showing other examples of the illuminating device. These illuminating devices use a color mixing means for guiding to a rod integrator emission light from a plurality of light sources.

An illuminating device 351 in FIG. 21 is provided with three light sources 211a, 211b, and 211c for emitting lights of three respectively different colors. Lights emitted from these three light sources 211a, 211b, and 211c are guided by a dichroic cube 261, which is the color mixing means, in the same or approximately same direction, and as a result, these lights are mixed. At a subsequent level (on a light exit surface) of the dichroic cube 261, there is provided a rod integrator 240 for rendering uniform intensity distribution on an object to be illuminated. A light entrance surface of the dichroic cube 261 is smaller than a light exit surface (light emission range) of an angle control lens 231.

Light of each color from the angle control lens 231 of each light source 211 is incident upon three light entrance surfaces of the dichroic cube 261, respectively. Around each light entrance surface of the dichroic cube 261, a plurality of first reflection member 253 are provided. Each first reflection member 253 has one end side positioned at a corner of the dichroic cube 261, and has the other end side positioned at an edge of a converging element 231. Four pieces of the first reflection member 253 may be arranged for one converging element 231. The four pieces of the first reflection member 253 are arranged to be tapered in shape (cross-sectional surface thereof is in a shape of a trapezoid). With the illuminating device 351 having such the configuration, it is possible to improve exploiting efficiency of the light of each color to the dichroic cube 261. The light of each color is guided to the same or approximately same direction by the dichroic cube 261. In addition, the light of each color repeats reflections within the rod integrator 240, and as a result, intensity distribution of the light of each color is rendered uniform on the object to be illuminated.

In addition, in order to obtain the projection type video display apparatus, a liquid crystal display panel, and an optical system not shown may be provided on a side of the light exit surface of the rod integrator 240.

Similar to the illuminating device 351, an illuminating device 361 shown in FIG. 22 guides the light of each color emitted from the three light sources in the same or approximately the same direction by a dichroic cube 262, as a result, the light of each color is mixed. A size of a light entrance surface of the dichroic cube 262 of the illuminating device 361 is approximately the same as that of a light exit surface of a converging element 31. A size of a light entrance surface of the rod integrator 240 is smaller than that of a light exit surface of the dichroic cube 262. Around the light entrance surface of the rod integrator 240, a first reflection member 254 is arranged. Out of lights emitted from the light exit surface of the dichroic cube 262, the light advancing to an outside of the light entrance surface of the rod integrator 240 is returned by the first reflection member 254 to the dichroic cube 262 and then, re-used.

As a result, exploiting efficiency of the light of each color to the rod integrator 240 is improved. In order to obtain a projection type video display apparatus, a liquid crystal display panel and a projection optical system not shown may be provided in a light-emission portion of the rod integrator 240.

In the above illuminating devices 351, 361, the liquid crystal display panel has structure with an RGB color filter, or structure without the RGB color filter. In a case of using the liquid crystal display panel having the structure with the RGB color filter, the light source of each color of RGB is continuously illuminated. In a case of using the liquid crystal display panel having the structure without the RGB color filter, the light source of each color of RGB is illuminated in a time-sequential manner. In addition, in the above illuminating devices 351, 361, as a color mixing means, besides the dichroic cube, an element capable of switching between transmission and reflection in a time-sequential manner may be used. In this case, in synchronization with switching timing of the transmission and the reflection, the light source of each RGB color is illuminated in the time-sequential manner.

An illuminating device 371 shown in FIG. 23 is an illuminating device of another example in which light of each color emitted from three light sources is guided by a dichroic cube in the same or approximately the same direction, and as a result, the lights are mixed. In addition, FIG. 23 also shows a projection type video display apparatus using the illuminating device 371. On each light entrance surface of the dichroic cube 261, liquid crystal display panels 281a, 281b, and 281c for each color, and rod integrators 242 are arranged. A light entrance surface of the rod integrator 242 is smaller than a light exit surface (light-emission range) of the angle control lens 231. Around the light entrance surface of each rod integrator 242, a first reflection member 255 is arranged. Each light (image light of each color) modulated by the liquid crystal display panel 281 for each color is guided by the dichroic cube 261 in the same direction, and as a result, full-color image light is generated.

The above illuminating devices 351, 361, and 371 may be provided with a reflective polarizer and a ¼λ plate, it becomes possible to redirect a polarization component of the emission light by a polarization conversion in a common direction.

Modified Example

As the optical integrator of the present invention, the rod integrator is used as one example. However, as the optical integrator, a fly's eye lens may be used.

As the light source of the present invention, the LED light source is used as one example. However, another solid light source, or another small-sized light source may be used.

In the projection type video display apparatus of the present invention, the transmissive liquid crystal display panel is used as one example. However, a reflective liquid crystal display panel (LCOS), an optical modulation element (digital micro mirror device) in which micro mirrors are arranged in an array shape, etc., may be used.

It is to be understood that the embodiment, and the experimental examples disclosed as above are illustrative, and not restrictive in its every respect. The scope of the invention is defined by the appended claims rather than by the description preceding them, and all changes that fall within meets and bounds of the claims, or equivalence of such meets and bounds are therefore intended to be embraced by the claims.

What is claimed is:

1. A converging element for guiding the light emitted from a light emitting element to a predetermined direction, comprising:
   a light-incidence area for receiving the light emitted from the light emitting element;
   a first light-emission area for directly receiving center emission light, out of lights emitted from the light emitting element, incident from the light incidence area, and for emitting the light in the predetermined direction;
   a reflection area for receiving and reflecting a peripheral emission light, out of the lights emitted from the light emitting element, incident from the light incidence area;
   a second light-emission area, formed on a peripheral side of the first light-emission area, for receiving light reflected in the reflection area and for emitting the light to the predetermined direction;
   a third light-emission area, formed between the first light-emission area and the second light-emission area, for directly receiving the peripheral emission light, out of lights emitted from the light emitting element, incident from the light incidence area, and for emitting the light to the predetermined direction; and
   each of the areas being formed of a respectively different surface.

2. A converging element according to claim 1, wherein the first light-emission area and the third light-emission area are formed of convex curved surfaces.

3. A converging element according to claim 1, further comprising a light-incidence local area formed on the light-incidence area and in a position for receiving lights advancing in a direction of the second light-emission area and a direction of the third light-emission area, wherein
   the light-incidence local area is optically constructed to guide the incident light to the third light-emission area, and
   the third light-emission area is optically constructed to emit the light from the light-incidence local area in the predetermined direction.

4. An illuminating device, comprising:
   the converging element according to claim 1; and
   a light emitting element arranged in the light-incidence area of the converging element.

5. An illuminating device according to claim 4, further comprising an optical integrator for rendering uniform on an object to be illuminated intensity of the light emitted from the converging element.

6. A converging element, comprising:
   a transparent first optical means, for receiving the light emitted from a light emitting element, and for guiding the light to a predetermined direction;
   a reflective second optical means, provided in a position for receiving peripheral emission light of the first optical means, for guiding the peripheral emission light in a direction approximately crossing a center axis of the first optical means; and
   a reflective third optical means, arranged close to the center axis inward of the second optical means, for guiding in a direction approximately the same as the predetermined direction by reflecting the peripheral emission light reflected by the second optical means.

7. A converging element according to claim 6, wherein an area ahead of a center portion of the first optical means is shielded by the third optical means.

8. A converging element according to claim 7, wherein the first optical means emits light only from a peripheral side thereof, and the light-incidence area of the first optical means is in such a shape as to guide to the peripheral side most of light from a laterally-emitting light emitting element.

9. An illuminating device, comprising:
   the converging element according to claim 6; and
   a light emitting element for irradiating light onto a light-incidence area of the converging element.

10. An illuminating device according to claim 9, further comprising an optical integrator for rendering uniform on an object to be illuminated intensity of the light emitted from the converging element.

11. An illuminating device, comprising:
    a light source including a light emitting element;
    a light guide means for receiving center emission light, out of emission lights from the light source, and for guiding the light to an object to be illuminated, the light guide means comprising a first reflection means provided on a side peripheral to a light entrance surface of the light guide means, the first reflection means reflecting peripheral emission light from the light source; and;

a second reflection means, provided near the light emitting element, for reflecting in a direction of the light guide means the light reflected by the first reflection means.

12. An illuminating device according to claim 11, wherein the light source comprises between the light emitting element and the light guide means, a converging element for guiding the light to a predetermined direction by controlling an emission angle of the light emitted from the light emitting element.

13. An illuminating device according to claim 12, wherein the converging element comprising:

a light-incidence area for receiving light emitted from the light emitting element;

a first light-emission area for directly receiving a center emission light, out of lights emitted from the light emitting element, incident from the light incidence area, and for emitting the light in the predetermined direction;

a reflection area for receiving and reflecting a peripheral emission light, out of the lights emitted from the light emitting element, incident from the light incidence area;

a second light-emission area, formed on a peripheral side of the first light-emission area, for receiving light reflected in the reflection area and for emitting the light to the predetermined direction, and each of the areas being formed of a respectively different surface.

14. An illuminating device according to claim 11, wherein the light guide means is an optical integrator.

* * * * *